(12) United States Patent
Shiratake

(10) Patent No.: US 6,990,007 B2
(45) Date of Patent: Jan. 24, 2006

(54) SEMICONDUCTOR MEMORY DEVICE

(75) Inventor: Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/893,949

(22) Filed: Jul. 20, 2004

(65) Prior Publication Data
US 2005/0254328 A1    Nov. 17, 2005

(30) Foreign Application Priority Data
May 17, 2004   (JP) .............................. 2004-146469

(51) Int. Cl.
*G11C 11/22* (2006.01)
(52) U.S. Cl. .................. 365/145; 365/230.03; 365/205
(58) Field of Classification Search ................ 365/145, 365/230.03, 205
See application file for complete search history.

(56) References Cited

U.S. PATENT DOCUMENTS

| | | | |
|---|---|---|---|
| 6,198,653 B1 | 3/2001 | Tanaka | |
| 6,498,743 B2 | 12/2002 | Maruyama | |
| 6,934,177 B2 * | 8/2005 | Takashima | .................. 365/145 |

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes a first cell group having serial-connected memory cells. The memory cell includes a ferroelectric capacitor and a transistor which are connected in parallel. A first bit line is selectively electrically connected to one end of the first cell group. A second bit line is selectively electrically connected to the other end of the first cell group. A first power supply connection circuit selectively electrically connects a power supply line having a first potential to the second bit line. A sense amplifier has a first terminal electrically connected to the first bit line, generates one of first and second potentials onto the first terminal according to data stored in the memory cell and generates the other one of the first and second potentials onto a second terminal thereof. A first bit line connection circuit selectively electrically connects the second terminal to the second bit line.

16 Claims, 22 Drawing Sheets

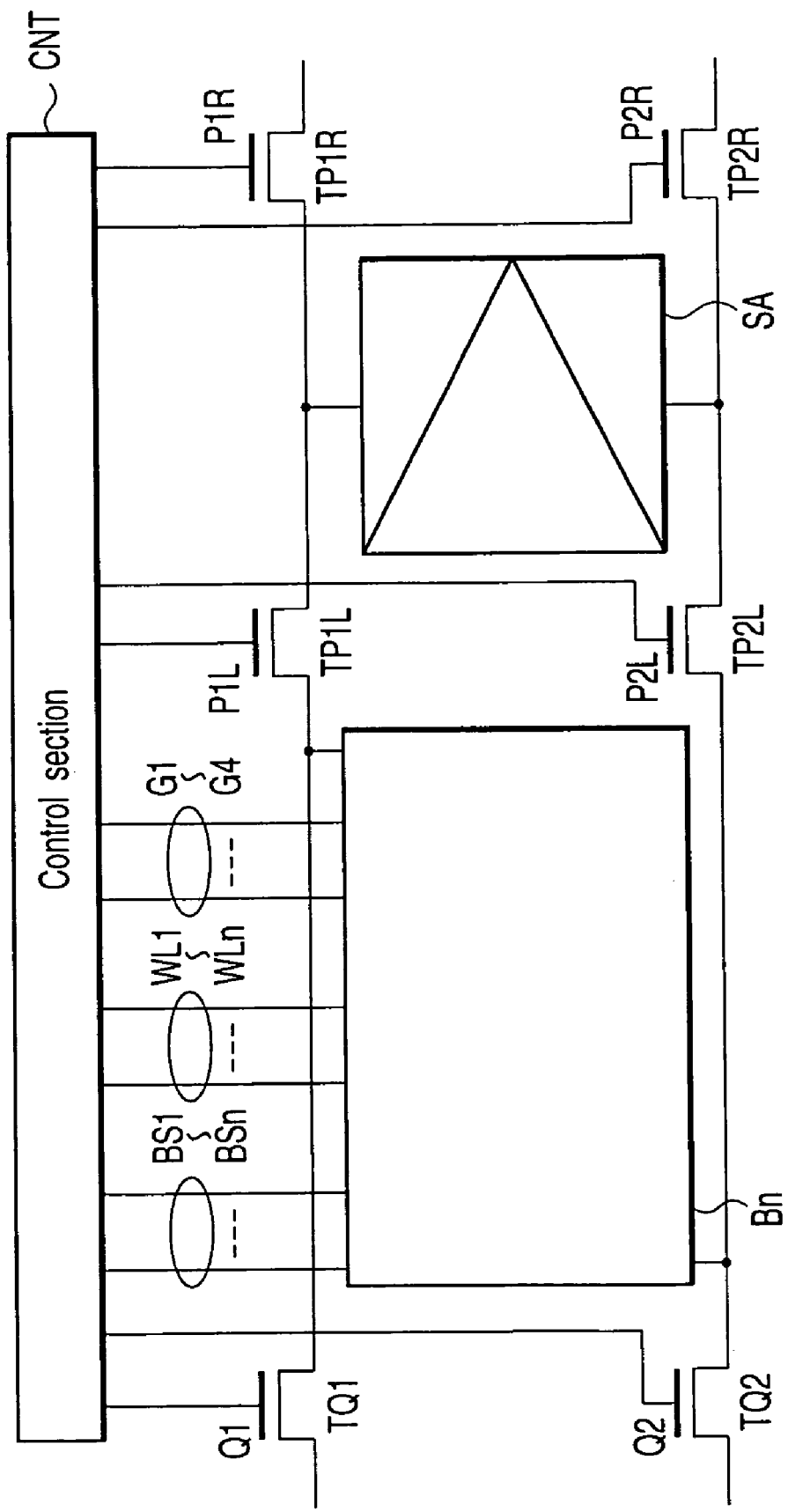
F I G. 3

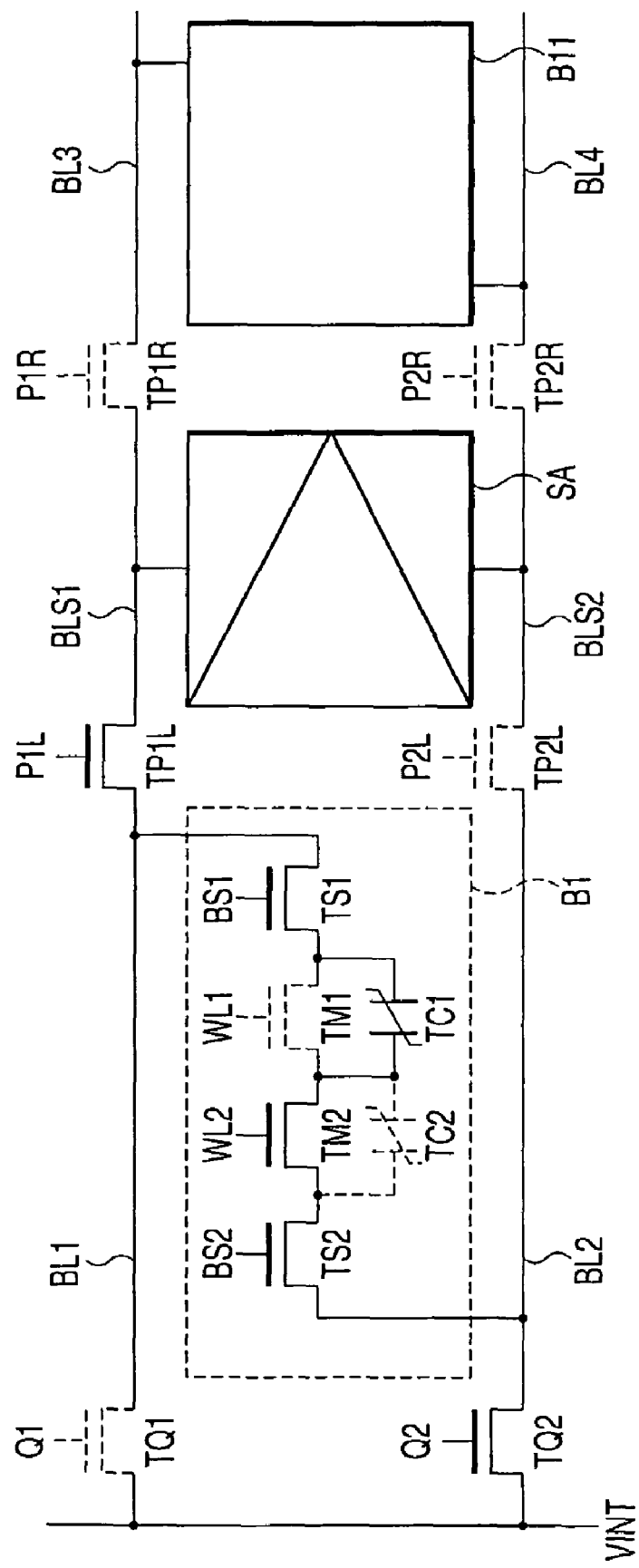
F I G. 5

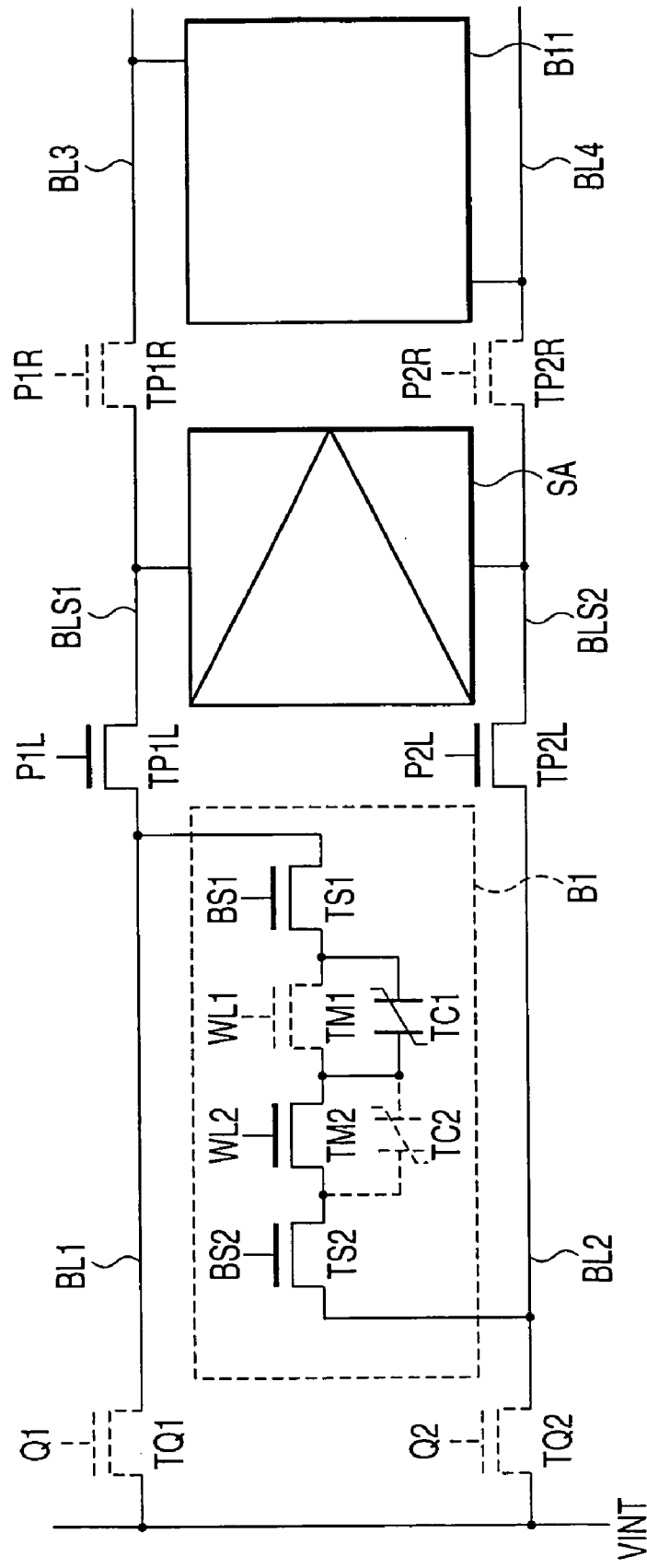
F I G. 6

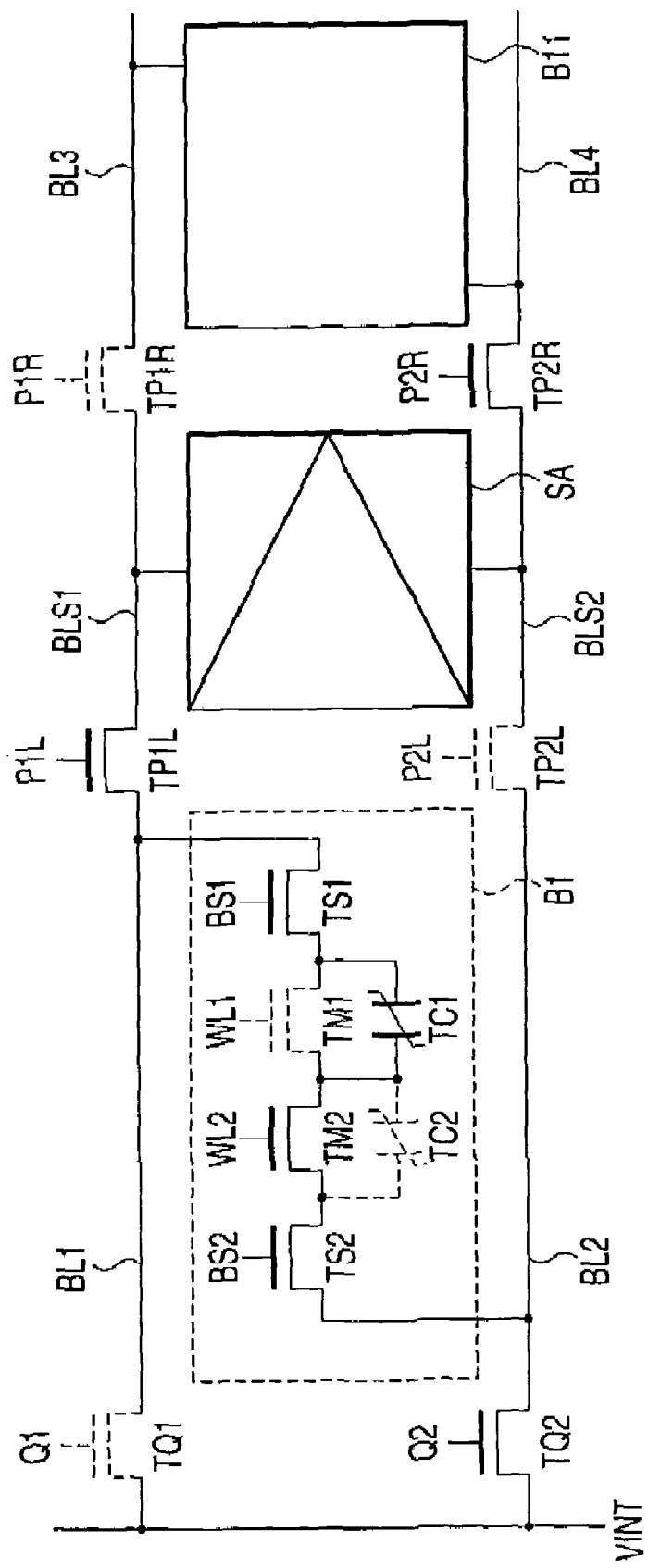
F I G. 9

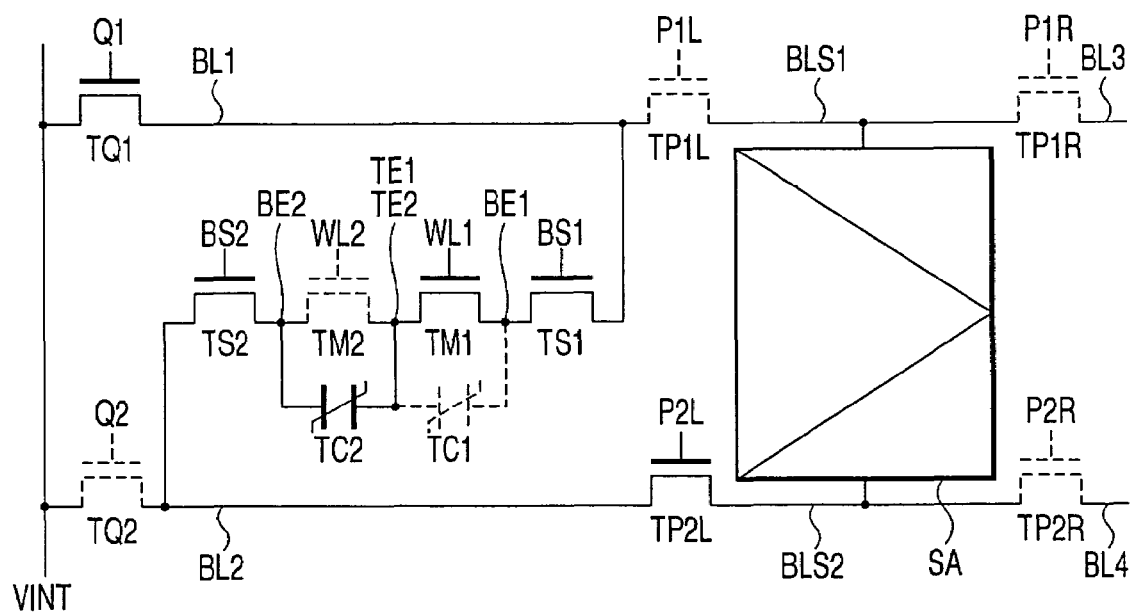
F I G. 19

SEMICONDUCTOR MEMORY DEVICE

CROSS-REFERENCE TO RELATED APPLICATIONS

This application is based upon and claims the benefit of priority from prior Japanese Patent Application No. 2004-146469, filed May 17, 2004, the entire contents of which are incorporated herein by reference.

BACKGROUND OF THE INVENTION

1. Field of the Invention

The present invention relates to a semiconductor memory device, for example, a semiconductor memory device in which a ferroelectric material is used to form memory cells.

2. Description of the Related Art

A ferroelectric memory (ferroelectric random access memory: FeRAM) stores binary data in a nonvolatile fashion based on the fact that states of two charge amounts (polarization amounts) Q can be set when a voltage applied to a ferroelectric material is zero. The memory cell is configured by a ferroelectric capacitor having a ferroelectric film sandwiched between two electrodes.

In the conventional ferroelectric memory, one end of a circuit of a ferroelectric capacitor and cell transistor which are connected in parallel is connected to a plate line and the other end thereof is connected to a bit line. The potential of the bit line varies according to the polarization state of the ferroelectric capacitor by setting potentials of the word line and plate line to a high level. It is assumed that a case wherein the potential that is read onto the bit line after inversion of the polarization state corresponds to "1" data, for example, and a case wherein the potential that is read without inversion of the polarization state corresponds to "0" data, for example.

A potential read out onto the bit line is amplified to a low or high level by the sense amplifier in the case of "0" or "1" data, respectively. After this, if data held is "0", data is rewritten by respectively applying high and low levels to one end and the other end of the ferroelectric capacitor. Therefore, the "0" rewriting operation is instantly terminated by holding the potential of the plate line at the high level and amplifying the potential of the bit line to the low level. In the case of "1" data, the rewriting operation is performed by respectively applying low and high levels to one end and the other end of the ferroelectric capacitor. The "1" rewriting operation can be attained by amplifying the potential of the bit line to the high level and setting the potential of the plate line to the low level.

Thus, it is necessary to set up two voltage application states in one read cycle in order to perform the rewriting operation for "0" data and "1" data. For this reason, it is difficult to reduce the read time.

BRIEF SUMMARY OF THE INVENTION

According to a first aspect of the invention, there is provided a semiconductor memory device comprising: a first cell group having at least two memory cells which are serially connected, the memory cell including a ferroelectric capacitor and a transistor which are connected in parallel; a first bit line selectively electrically connected to one end of the first cell group; a second bit line selectively electrically connected to another end of the first cell group; a first power supply connection circuit which selectively electrically connects a power supply line to the second bit line, the power supply line having a first potential; a sense amplifier which has a first terminal electrically connected to the first bit line, generates one of the first potential and a second potential onto the first terminal according to data stored in the memory cell and generates another one of the first potential and the second potential onto a second terminal thereof; and a first bit line connection circuit which selectively electrically connects the second terminal to the second bit line.

BRIEF DESCRIPTION OF THE SEVERAL VIEWS OF THE DRAWING

FIG. 3 is a diagram showing part of the configuration which is common in the embodiments;

FIG. 5 is a diagram showing one state of the semiconductor memory device at the operation time shown in FIG. 4;

FIG. 6 is a diagram showing one state of the semiconductor memory device at the operation time shown in FIG. 4;

FIG. 9 is a diagram showing one state of the semiconductor memory device at the operation time shown in FIG. 8;

FIG. 19 is a diagram showing one state when data is read out from the ferroelectric capacitor of the circuit of FIG. 1;

DETAILED DESCRIPTION OF THE INVENTION

There will now be described embodiments of the present invention with reference to the accompanying drawings. In this explanation, common reference symbols are attached to constituents which have substantially the same functions and configurations and repetitive explanation is made only when necessary.

First Embodiment

Figure 1:
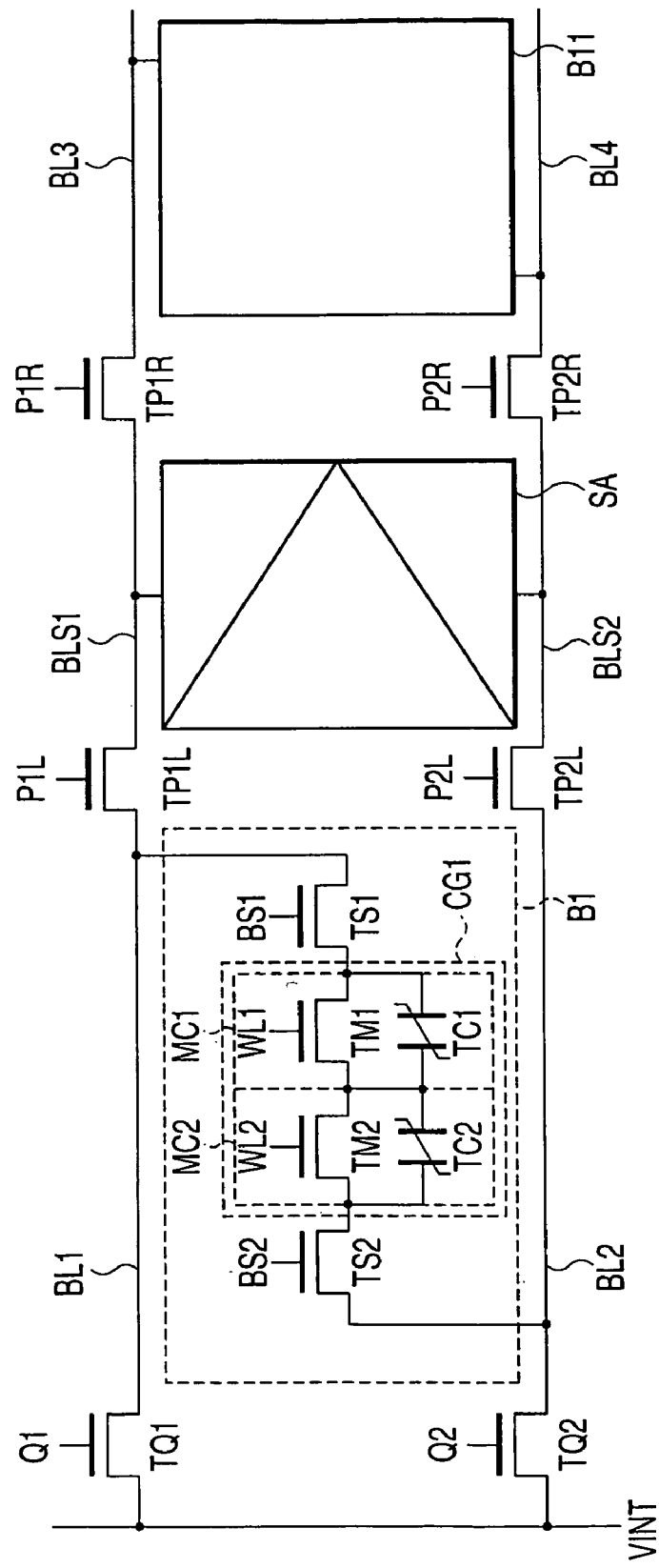
FIG. 1 is a diagram showing the configuration of a main section of a semiconductor memory device according to a first embodiment of the present invention.

FIG. 1 is a diagram showing the configuration of a main section of a semiconductor memory device according to a first embodiment of the present invention. A power supply line VINT is connected to a bit line (first bit line) BL1 via an n-type MOS (metal oxide semiconductor) transistor (second power supply connection circuit) TQ1. The bit line BL1 is connected to a bit line BLS1 (first terminal of sense amplifier SA) via an n-type MOS transistor (second bit line connection circuit) TP1L. The bit line BLS1 is connected to a bit line (fourth bit line) BL3 via an n-type MOS transistor TP1R. The power supply line VINT is set to a potential (driving potential) which is required to generate voltage applied to the ferroelectric capacitor at the data read time. The driving potential (first potential) corresponds to the potential of the conventional plate line and, for example, it is set at 2.5 V. The gates of the transistors TQ1, TP1L, TP1R are respectively supplied with signals Q1, P1L, P1R.

Further, the power supply line VINT is connected to a bit line (second bit line) BL2 via an n-type MOS transistor (first power supply connection circuit) TQ2. The bit line BL2 is connected to a bit line BLS2 (second terminal of sense amplifier SA) via an n-type MOS transistor (first bit line connection circuit) TP2L. The bit line BLS2 is connected to a bit line (third bit line) BL4 via an n-type MOS transistor TP2R. The gates of the transistors TQ2, TP2L, TP2R are respectively supplied with signals Q2, P2L, P2R.

Block B1 is connected between the bit lines BL1 and BL2. The block B1 includes a cell group CG1 containing at least one series-connected memory cell MC1 (MC2), a block selection transistor (first block connection circuit) TS1 and a block selection transistor (second block connection circuit) TS2. The number of memory cells MC provided in the cell group CG1 can be set to a desired number and is not limited to two as shown in FIG. 1. In this case, it is preferable to set the number of memory cells MC to the power of 2, for example, 4, 8, 16 for convenience in the circuit design.

The memory cell MC1 includes a ferroelectric capacitor (cell capacitor) TC1 and cell transistor TM1 which are connected in parallel. Likewise, the memory cell MC2 includes a ferroelectric capacitor TC2 and cell transistor TM2 which are connected in parallel. The other end of the memory cell MC1 is connected to one end of the memory cell MC2. The gates of the cell transistors TM1, TM2 are connected to the word lines WL1, WL2, respectively. When the potential is read out from the memory cell MC1 or MC2 with inversion of polarization, a high potential occurs on the bit line BL1. On the other hand, if the potential is read out without inversion of polarization, a low potential occurs on the bit line. Typically, a case wherein high potential occurs is dealt with as "1" data and a case wherein low potential occurs is dealt with as "0" data. It is of course possible to reverse the above relation. If the memory cells MC1, MC2 does not need to be distinguished from each other in the following description, the memory cells MC1, MC2 are representatively referred as the memory cell MC. This applies to the other reference symbols.

One end of the block selection transistor TS1 is connected to the bit line BL1 and the other end thereof is connected to one end of the cell group CG1 (one end of the memory cell MC1). One end of the block selection transistor TS2 is connected to the other end of the cell group CG1 (the other end of the memory cell MC2) and the other end thereof is connected to the bit line BL2. The gates of the block selection transistors TS1, TS2 are supplied with block selection signals BS1, BS2.

A sense amplifier SA is connected between the bit lines BLS1 and BLS2. The sense amplifier SA amplifies the potential of the bit line BLS1 to one of a ground potential (second potential) Vss and a driving potential VINT according to the potential read out onto the bit line BL1 from the memory cell MC, and generates the other one of the ground potential Vss and driving potential VINT at the second terminal. That is, if the potential read out onto the bit line BLS1 from the memory cell MC1, MC2 is a low potential, the sense amplifier drives the potential to the ground potential Vss and generates the driving potential VINT on the bit line BLS2. On the other hand, if the potential read out onto the bit line BLS1 from the memory cell MC1, MC2 is a high potential, the sense amplifier drives the potential to the driving potential VINT and generates the ground potential Vss on the bit line BLS2.

Further, when a potential is read out onto the bit line BLS2 from the memory cell MC1, MC2, the same operation is performed. That is, the sense amplifier amplifies the potential of the bit line BLS2 to one of the ground potential Vss and driving potential VINT and generates the other one of the ground potential Vss and driving potential VINT on the bit line BLS1.

Figure 2:
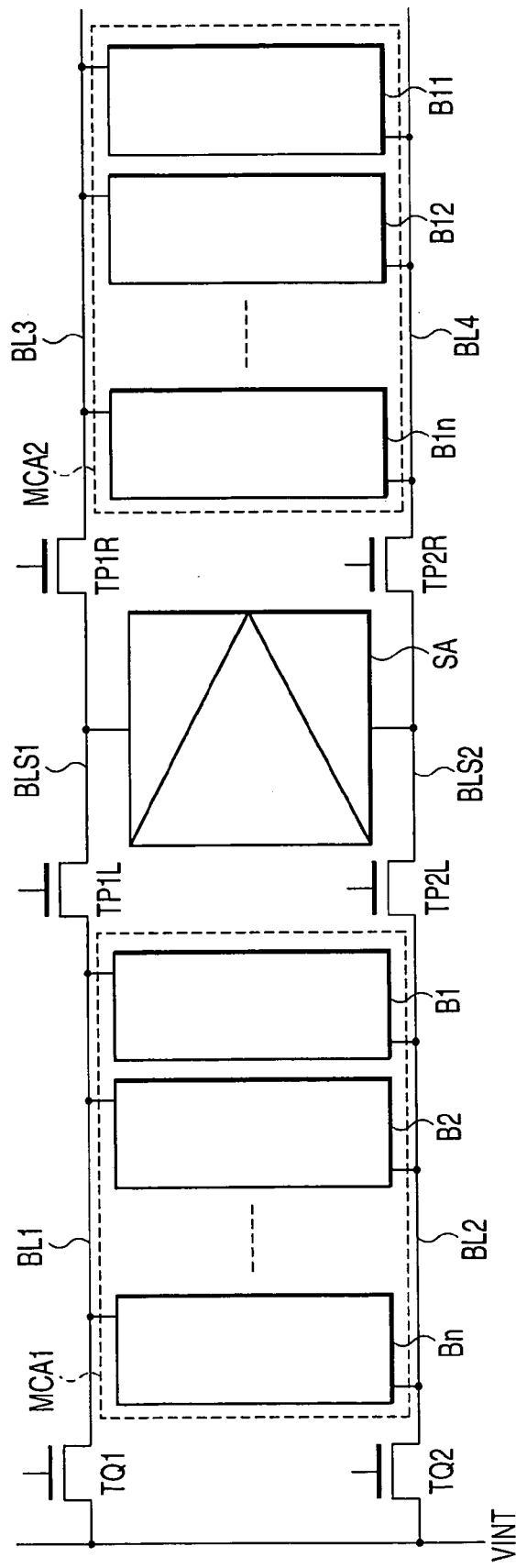
FIG. 2 is a diagram showing another configuration of first embodiment.

Like the block B1, a block B11 including a cell group and two block selection transistors which are serially connected is connected between the bit lines BL3 and BL4. The blocks B1, B11 belong to different memory cell arrays MCA. As shown in FIG. 2, blocks B2 to Bn having the same configuration as that of the block B1 can be connected between the bit lines BL1 and BL2. A memory cell array MCA1 is configured by the blocks B1 to Bn. Likewise, blocks B12 to B1n having the same configuration as that of the block B1 can be connected between the bit lines BL3 and BL4. A memory cell array MCA2 is configured by the blocks B11 to B1n.

The transistors TQ1, TQ2, TP1L, TP1R, TP2L, TP2R, TS1, TS2 each have a function as a connection circuit in which the electrical conductive or nonconductive state between the two ends can be controlled by an electrical control operation. A circuit having the same function can be used instead of the transistor.

FIG. 3 is a diagram showing part of the configuration which is common in the embodiments. As shown in FIG. 3, the signals Q1, Q2, P1L, P1R, P2L, P2R, block selection signals BS1, BS2 and potentials of the word lines WL1, WL2 are controlled by a control section CNT. The control section CNT may contain a row decoder. Like the embodiments described below, potentials of the word lines WL1 to WLn and block selection signals BS1 to BSn in all of the blocks Bn (n is a natural number) in each of the embodiments are controlled by the control section CNT. Signal lines other than the word lines WL1, WL2, block selection signals BS1 to BSn and block B1 shown in FIG. 1 are explained in the second and succeeding embodiments. Further, signals G1 to G4 are explained in the fifth embodiment.

Next, the operation of the semiconductor memory device shown in FIG. 1 is explained with reference to FIGS. 4 to 6. The following operation is explained by taking a case wherein the memory cell MC1 (selected memory cell) provided in the block B1 (selected block) among a plurality of blocks B (not shown) is subjected to a read operation as an example. When data is read out from the other memory cell MC in the other block B, a similar operation is performed.

Figure 4:
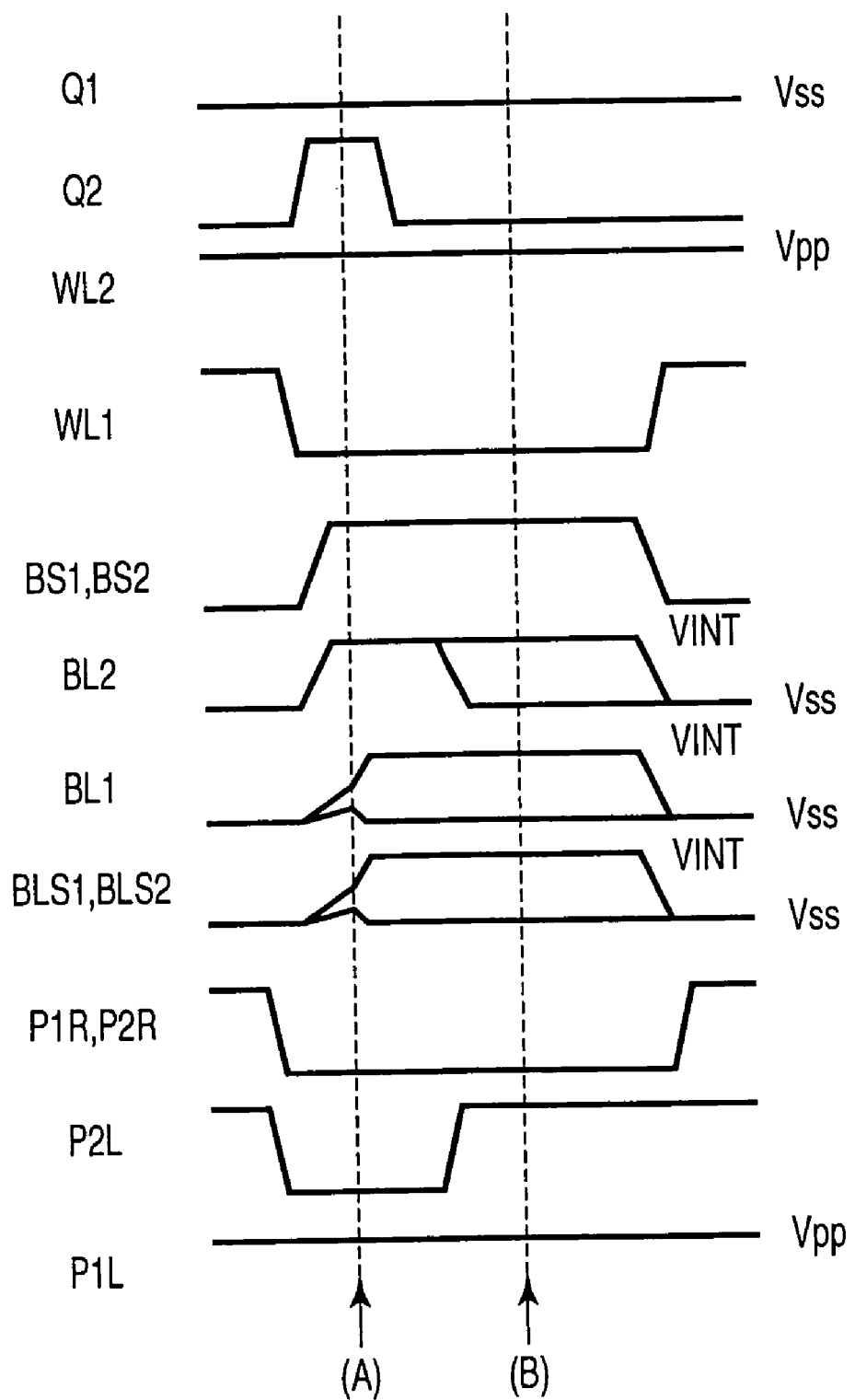
FIG. 4 is a timing chart showing an example of potentials of the main section of the semiconductor memory device according to the first embodiment.

FIG. 4 is a timing chart showing an example of potentials of the main section of the semiconductor memory device according to the first embodiment. FIGS. 5 and 6 are diagrams each showing one state of the semiconductor memory device at the operation time shown in FIG. 4. In FIGS. 5 and 6, transistors indicated by broken lines are transistors set in the OFF state and it is indicated that no voltage is applied to a capacitor indicated by broken lines.

As shown in FIG. 4, the bit lines BL1, BL2 are precharged to the ground potential Vss at the standby time. At this time, the signals Q1, Q2 are set at the low level. Therefore, the transistors TQ1, TQ2 are set in the OFF state.

Potentials of the signal lines P1L, P1R, P2L, P2R are set at the high level and the transistors TP1L, TP1R, TP2L, TP2R are set in the ON state. Therefore, the bit lines BLS1, BLS2 are set at the same potential as the bit lines BL1, BL2, that is, at the ground potential Vss.

Potentials of all of the word lines WL1, WL2 in the block B1 are set at the high level (potential Vpp) and both ends of the ferroelectric capacitor C1 and both ends of the ferroelectric capacitor C2 are set at the same potential. Further, the block selection signals BS1, BS2 are set at the low level and the block selection transistors TS1, TS2 are both set in the OFF state.

As shown in FIGS. 4, 5, the bit line BL2 is electrically isolated from the bit line BLS2 by setting the potential of the signal line P2L to the low level at the data read time. At this time, the transistors TP1R, TP2R are turned OFF by setting the potentials of the signal lines P1R, P2R to the low level. As a result, the bit line BLS1 is electrically isolated from the bit line BLS3 and the bit line BLS2 is electrically isolated from the bit line BLS4. In this case, the potential of the signal line P1L is kept at the high level and the transistor TP1L is kept in the ON state. In this state, when the potential of the signal line Q2 is set to the high level, the transistor TQ2 is turned ON state and the potential of the bit line BL2 is driven to the driving potential VINT. Further, only the word line WL1 among the word lines WL in the selected block B1, which is connected to the selected memory cell MC1, is set to the low level.

Next, both of the block selection signals BS1, BS2 in the selected block B1 are set to the high level and the block selection transistors TS1, TS2 are set into the ON state. As a result, one end of the ferroelectric capacitor TC1 is connected to the bit line BL1 and the other end thereof is connected to the bit line BL2. Thus, the potential of the bit line BL1 (=ground potential Vss) is applied to one end of the ferroelectric capacitor TC1 and read potential VINT is applied to the other end thereof. Therefore, a read voltage (driving potential VINT—ground potential Vss) is applied across the ferroelectric capacitor TC1, the potential corresponding to data held in the ferroelectric capacitor TC1 appears on the bit line BL1 as indicated by timing A.

Next, the potential of one of the bit lines BLS1, BLS2 is amplified to the ground potential Vss and the potential of the other bit line is amplified to the read potential VINT by operating the sense amplifier SA. As a result, the ground potential Vss is applied to one end of the ferroelectric capacitor TC1 in the case of data "0" since it is connected to the bit line BL1 and the driving potential VINT is applied thereto in the case of data "1". After this, data of the bit lines BLS1, BLS2 is transferred to paired data lines (not shown) which are respectively connected to the bit lines BLS1, BLS2 via transistors (not shown).

As shown in FIGS. 4 and 6, the potential of the signal line Q2 is set to the low level and the transistor TQ1 is turned OFF to electrically isolate the power supply line VINT from the bit line BL2. Next, the potential of the signal line P2L is set to the high level to connect the bit line BL2 to the bit line BLS2. As a result, a potential complementary to the potential of the bit line BL1 is transferred to the bit line BL2 and then applied to the other end of ferroelectric capacitor TC1. That is, the driving potential VINT is applied in the case of data "0" and the ground potential Vss is applied in the case of data "1".

When the potential of the bit line BLS2 is applied to the other end of the ferroelectric capacitor TC2, complementary potentials (ground potential Vss and driving potential VINT) are applied to both ends of the ferroelectric capacitor TC2 irrespective of data held therein. That is, the rewriting operation of "0", "1" can be completed by one operation.

After this, the potential of the word line WL1, which is connected to the selected memory cell MC1, is set to the high level and the block selection signals BS1, BS2 are set to the low level. Next, the potentials of the signal lines P1R, P2R are set to the high level. Then, the standby state is set up by precharging the bit line BL1 (BLS1, BL3) and bit line BL2 (BLS2, BL4) to the ground potential.

The above operation example is explained by taking an example of the operation performed in a case wherein the bit line BL2 and the power supply line VINT are connected together and data is read out from the memory cell MC to the bit line BL1. However, it is possible to perform the operation of connecting the bit line BL1 and the power supply line VINT together and reading out data from the memory cell MC to the bit line BL2. In this case, the read operation is performed by changing the potentials of the respective portions as shown in FIG. 7.

Figure 7:
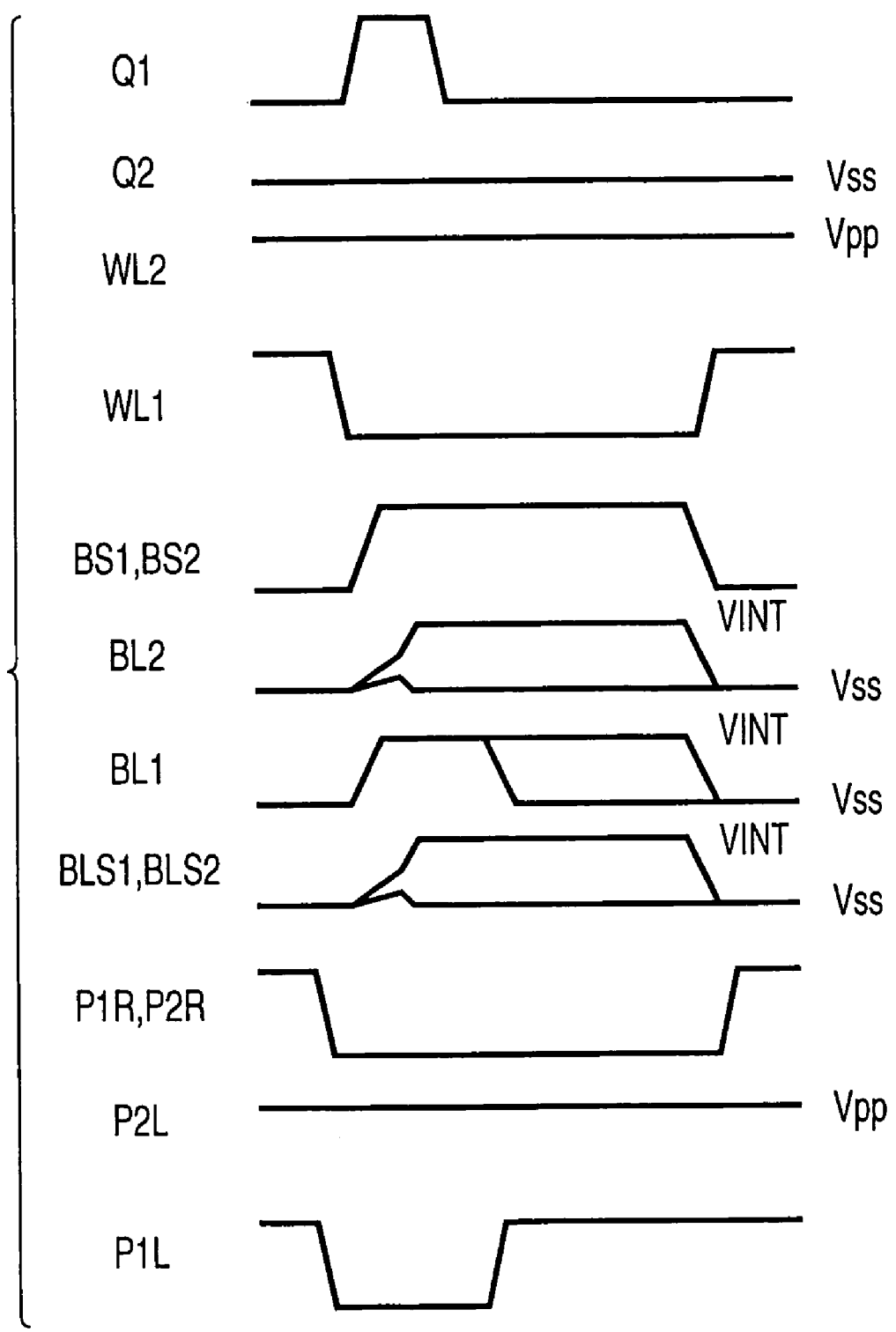
FIG. 7 is a timing chart showing another example of potentials of the main section of the semiconductor memory device according to the first embodiment.

FIG. 7 is a timing chart showing another example of potentials of the main section of the semiconductor memory device according to the first embodiment. Portions which are different from those of FIG. 4 are mainly explained below. First, in the standby state, the potential of the signal line P1L is set to the low level to electrically isolate the bit line BL1 from the bit line BLS1. At this time, potentials of the signal lines P1R, P2R are set to the low level. The potential of the signal line P2L is kept at the high level. In this state, the potential of the signal line Q1 is set to the high level to turn ON the transistor TQ1, thereby driving the potential of the bit line BL1 to the driving potential VINT.

Next, the word line WL1 is set to the low level and the block selection signals BS1, BS2 are set to the high level so that the potential corresponding to data held in the ferroelectric capacitor TC1 appears on the bit line BL2.

Then, the potential of one of the bit lines BLS1, BLS2 is amplified to the ground potential Vss and the potential of the other bit line is amplified to the driving potential VINT by operating the sense amplifier SA. Next, the signal line Q1 is set to the low level to turn OFF the transistor TQ1 and electrically isolate the power supply line VINT from the bit line BL1. After this, the signal line P1L is set to the high level to electrically connect the bit lines BL1 and BLS1 together. As a result, a potential complementary to the potential of the bit line BL2 is transferred to the bit line BL1 and then applied to the other end of the ferroelectric capacitor TC1. Thus, the rewriting operation is completed. Then, the standby state is set up.

According to the semiconductor memory device according to the first embodiment of the present invention, one end of the ferroelectric capacitor TC to be subjected to the read operation is connected to the first terminal BLS1 of the sense amplifier SA after amplification by the sense amplifier SA and the other end thereof is connected to the second terminal BLS2 of the sense amplifier SA. Since the potential of the first terminal BLS1 of the sense amplifier SA and the potential of the second terminal BLS2 are set in a complementary relation, two complementary potentials are supplied to both ends of the ferroelectric capacitors TC1, TC2 after amplification. Thus, the rewriting operation is completed by one operation irrespective of the polarity of data held in the ferroelectric capacitors TC1, TC2, and therefore, the rewriting time can be significantly reduced in comparison with a case wherein the two rewriting control operations are performed according to the polarity of data. That is, time required for one read cycle is reduced and, as a result, a semiconductor memory device which can attain the high speed operation can be provided.

Second Embodiment

A second embodiment has the same configuration as the first embodiment and a portion of method for controlling a potential is different. More specifically, a variation in the potential of the signal P2R is different.

Figure 8:
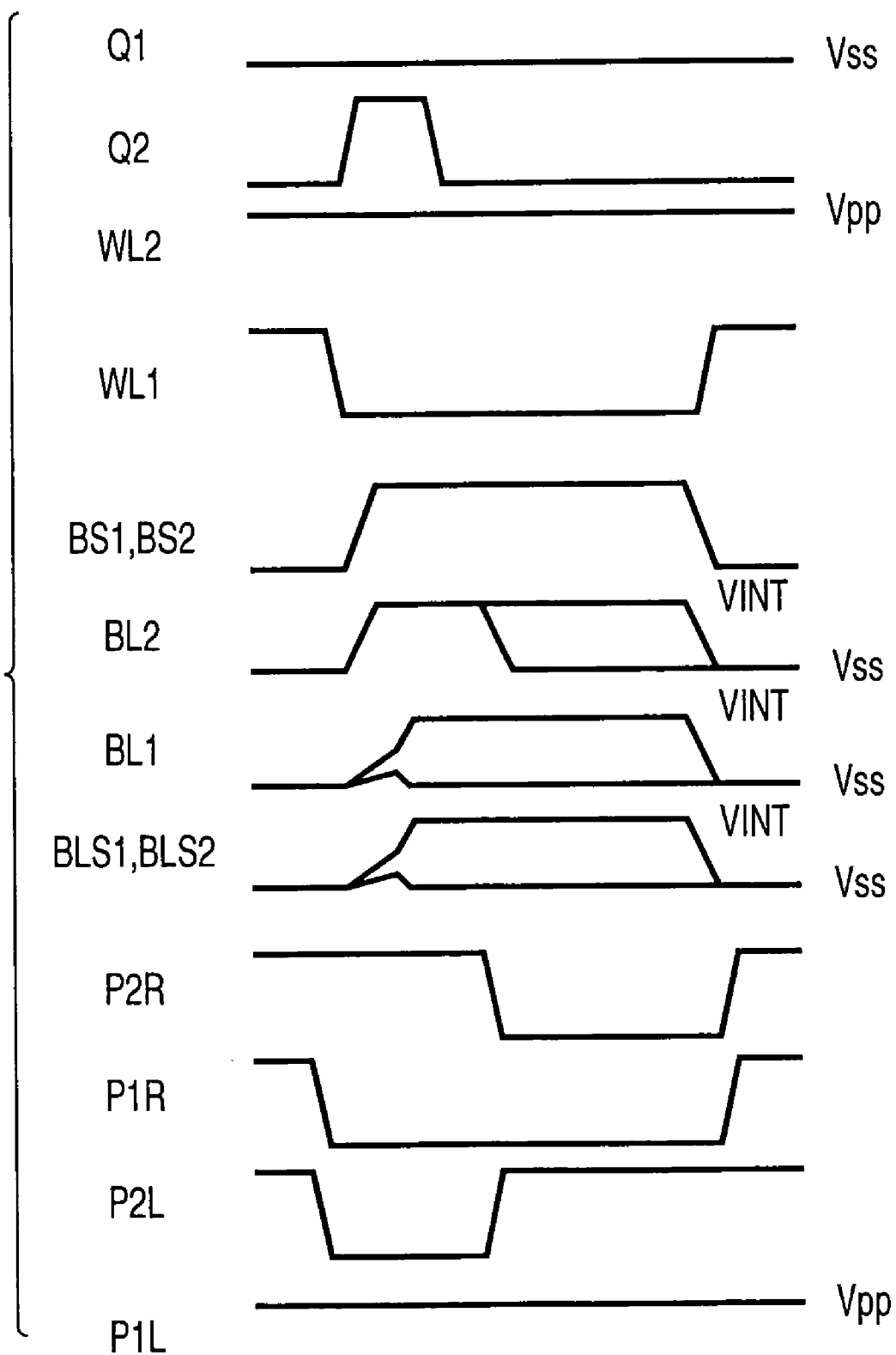
FIG. 8 is a timing chart showing an example of potentials of the main section of a semiconductor memory device according to a second embodiment of the present invention.

FIG. 8 is a timing chart showing an example of potentials of the main section of a semiconductor memory device according to the second embodiment of the present invention. FIG. 9 is a diagram showing one state of the semiconductor memory device at the operation time shown in FIG. 8. The operation of the semiconductor memory device according to the second embodiment is explained below with reference to FIGS. 8 and 9.

As shown in FIGS. 8 and 9, the signal P2R is kept at the high level until the amplifying operation by a sense amplifier SA is terminated. Therefore, the bit line BLS2 is connected to the bit line BL4. When the signal P2L is set to the high level, that is, when the rewriting operation is started, the signal P2R is set to the low level. The other operation is the same as that of the first embodiment.

The above explanation corresponds to a case wherein data is read out onto the bit line BL1 in the first embodiment. Likewise, when data is read out onto the bit line BL2, a bit line (reference bit line) or one of the bit lines BL1 and BL2 which is connected to the power supply line VINT is connected to a bit line BL3 (or bit line BL4) of an adjacent memory cell array MCA2. That is, the configuration is attained in which the signals P1R and P2R shown in FIG. 7 are replaced by the signals P1R and P2R shown in FIG. 8.

For example, the sense amplifier includes two series-connected circuits each having a p-type MOS transistor and n-type MOS transistor which are serially connected. Connection nodes of the two transistors are used as the first and second terminals. With the above configuration, if parasitic capacitances are significantly different between the first and second terminals, one of the potentials varies more rapidly than the other potential and an erroneous operation may occur. In the second embodiment, one of the first terminal BLS1 and second terminal BLS2 of the sense amplifier SA which is connected to the reference bit line is connected to the bit line BL3 (or BL4) of the adjacent memory cell array MCA2 during amplification. Therefore, the total amounts of the parasitic capacitances respectively associated with the first terminal BLS1 and second terminal BLS2 of the sense amplifier SA become substantially equal to each other. Thus, an erroneous operation which may be caused by imbalance between the parasitic capacitances of the sense amplifier SA can be prevented.

Like the first embodiment, according to the second embodiment of the present invention, one end of the ferroelectric capacitor TC to be subjected to the read operation is connected to the first terminal BLS1 of the sense amplifier SA and the other end thereof is connected to the second terminal BLS2 of the sense amplifier SA after amplification by the sense amplifier SA. Thus, the same effect as that of the first embodiment can be attained.

Further, according to the second embodiment, one of the first terminal BLS1 and second terminal BLS2 of the sense amplifier SA which is connected to the reference bit line is connected to the bit line BL3 (or BL4) of the adjacent memory cell array MCA2 during amplification. Therefore, an erroneous operation caused by imbalance between the parasitic capacitances of the sense amplifier SA can be prevented.

Third Embodiment

Figure 10:
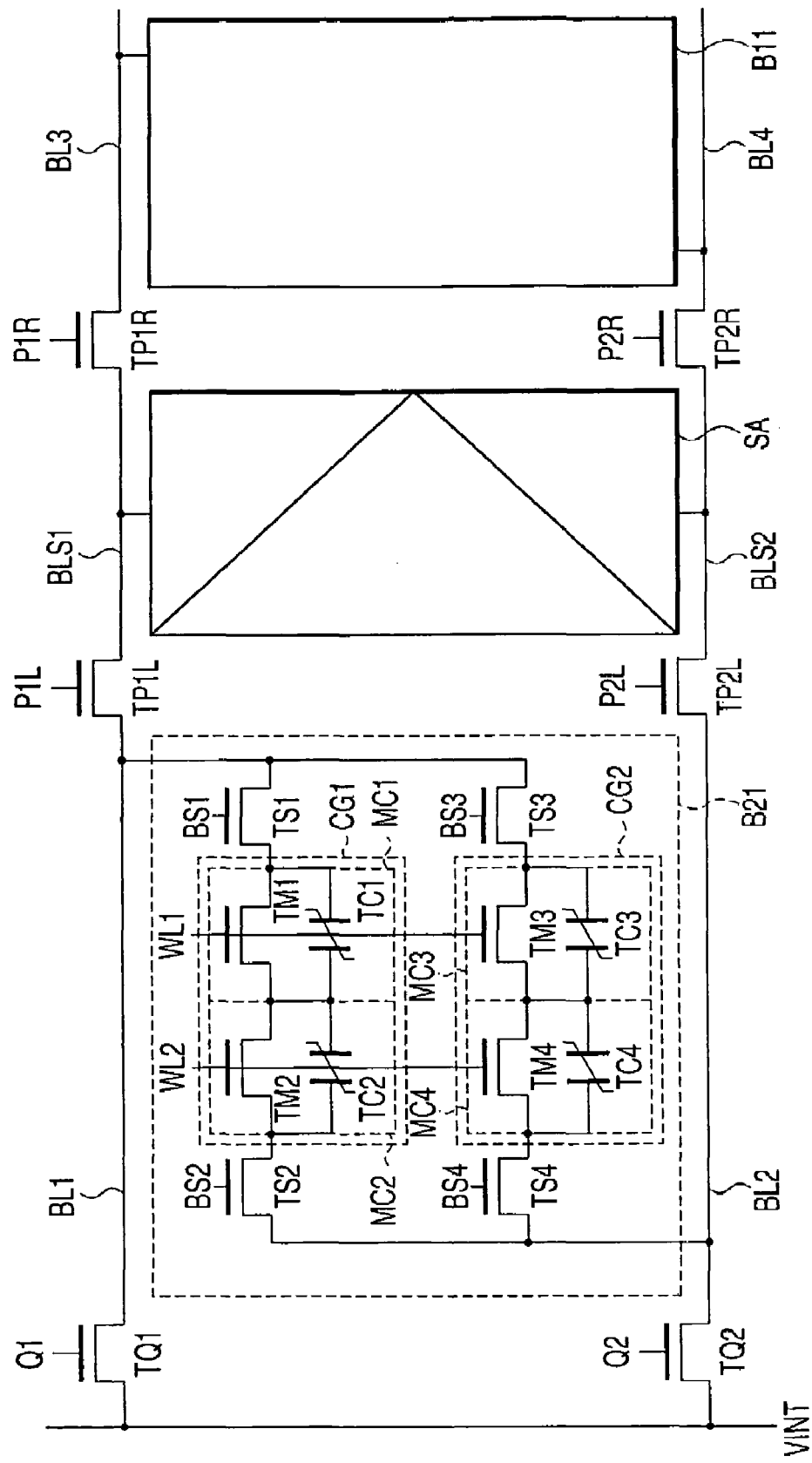
FIG. 10 is a diagram showing the configuration of a main section of a semiconductor memory device according to a third embodiment of the present invention.

In a third embodiment, the block configuration is different from that of the first embodiment. FIG. 10 is a diagram showing the configuration of the main section of a semiconductor memory device according to the third embodiment of the present invention. As shown in FIG. 10, a block B21 has a configuration in which two circuit configurations (which are hereinafter referred to as cell and selection transistor configurations) each having block selection transistors TS serially connected to two ends of a cell group CG are connected in parallel. That is, a block selection transistor TS3, cell group CG2 and block selection transistor TS4 which are serially connected are connected in addition to the configuration of FIG. 1 between the bit lines BL1 and BL2.

The cell group CG2 includes a memory cell MC3 having a ferroelectric capacitor TC3 and cell transistor TM3 connected in parallel and a memory cell MC4 having a ferroelectric capacitor TC4 and cell transistor TM4 connected in parallel. The gates of the cell transistors TM1, TM3 are connected to a word line WL1. The gates of the cell transistors TM2, TM4 are connected to a word line WL2. The remaining configuration is the same as that of the first embodiment. Block selection signals BS3, BS4 supplied to the gates of the block selection transistors TS3, TS4 are controlled by the control section CNT as shown in FIG. 3.

Figure 11:
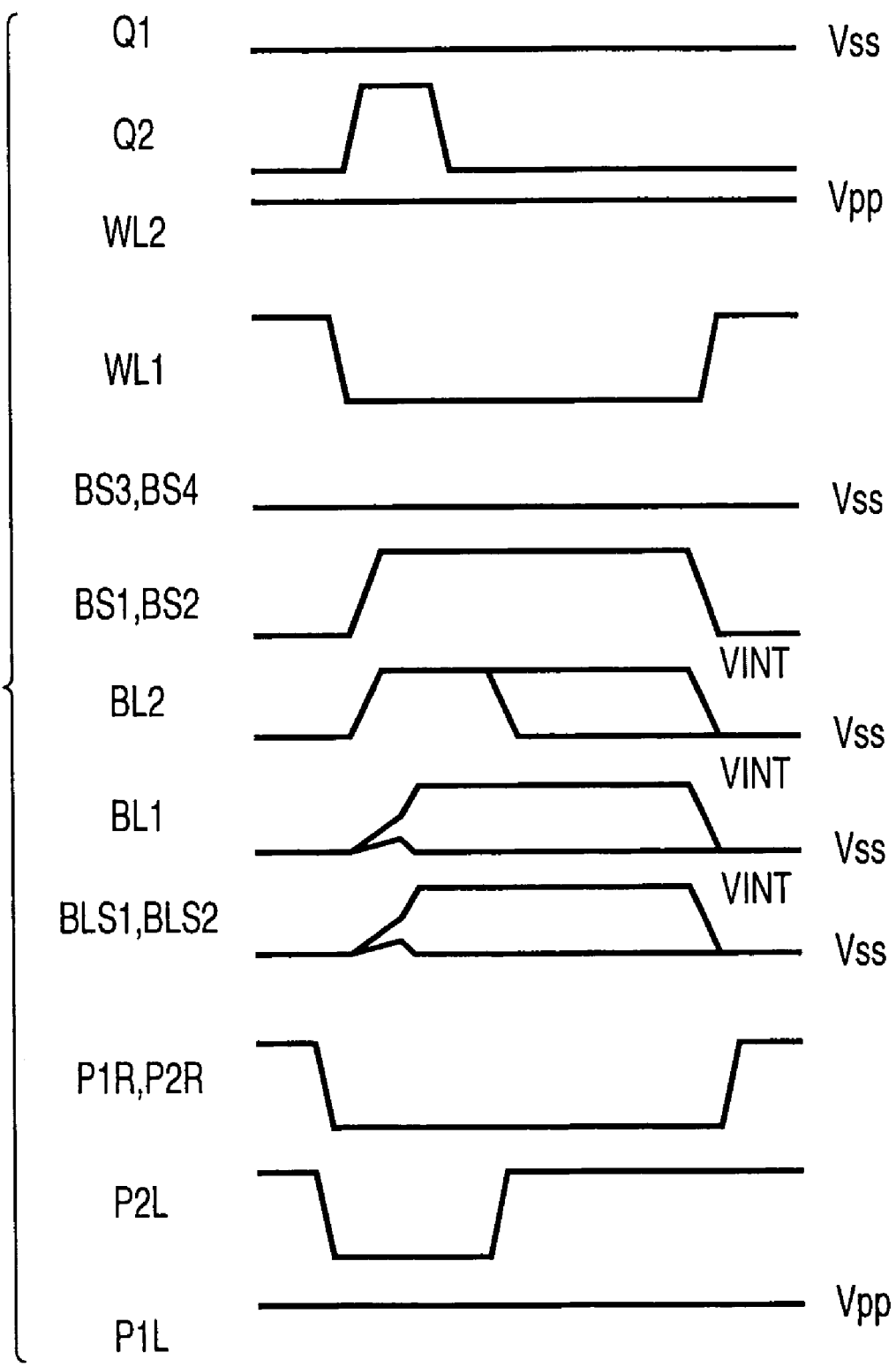
FIG. 11 is a timing chart showing an example of potentials of the main section of the semiconductor memory device according to the third embodiment.

FIG. 11 is a timing chart showing an example of potentials of the main section of the semiconductor memory device according to the third embodiment. FIG. 11 shows a case wherein the ferroelectric capacitor TC1 is subjected to the read operation. The operation of the semiconductor memory device of the third embodiment is the same as that of the first embodiment. As shown in FIG. 11, only the block selection transistors TS1, TS2 among the block selection transistors TS1 to TS4 in the block B2, which are connected to the respective ends of the cell group CG1 containing the ferroelectric capacitor to be accessed, are turned ON at the read time. The block selection transistors TS3, TS4 of the other cell group CG2 are maintained in the OFF state. That is, the block selection signals BS3, BS4 are kept set at the low level. When the ferroelectric capacitor belonging to the cell group CG2 is subjected to the read operation, the block selection transistors TS3, TS4 are turned ON and the block selection transistors TS1, TS2 are maintained in the OFF state. The operation performed after this is the same as that of the first embodiment shown in FIG. 4.

In FIG. 10, only one block is extracted and shown, but each block provided as shown in FIG. 2 can be configured to have the block B21 of FIG. 10. Further, the number of memory cells MC in one cell group CG can be set to a desired number as described in the first embodiment.

Figure 12:
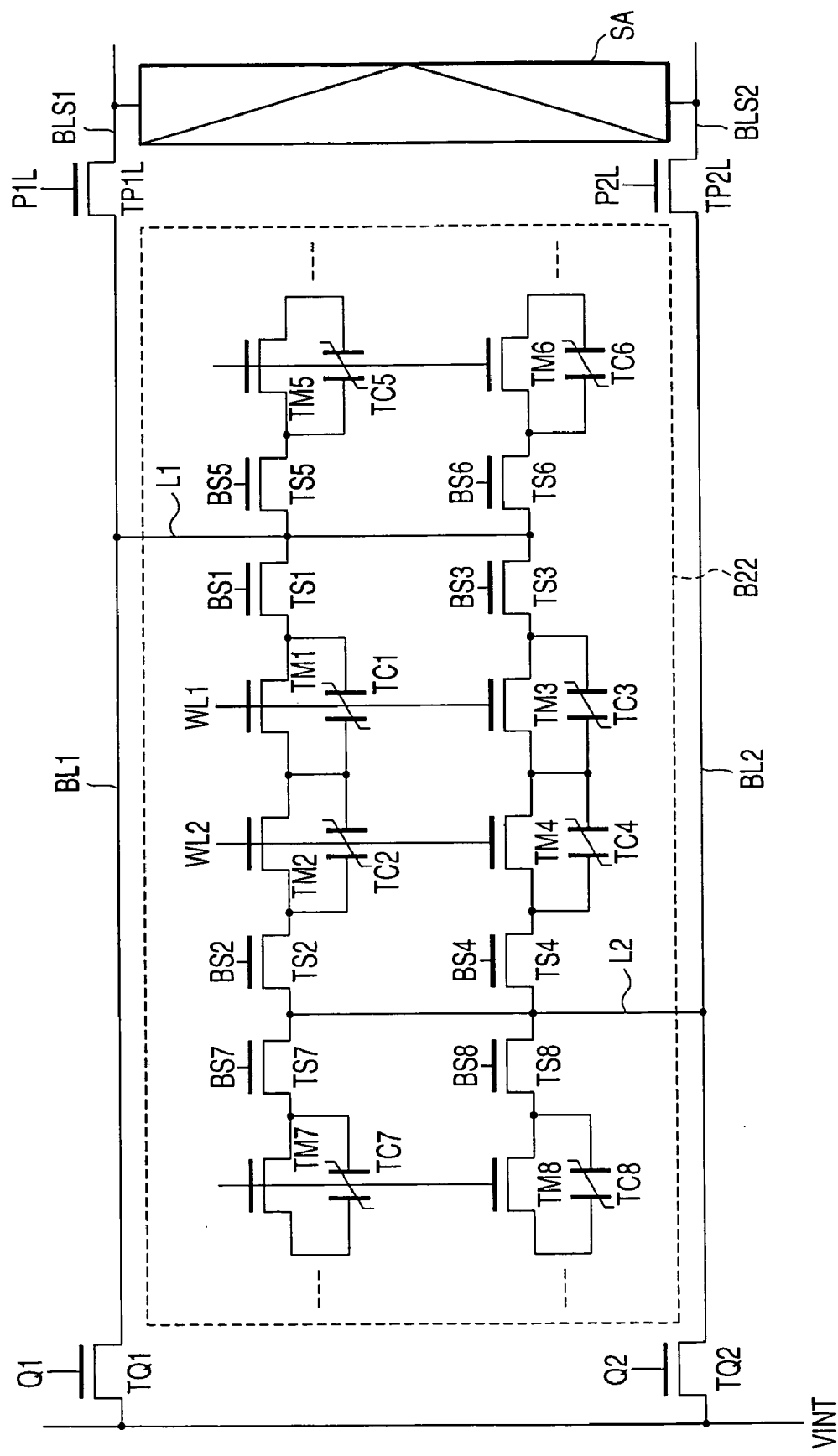
FIG. 12 is a diagram showing another example of a block configuration of the third embodiment.

FIG. 12 shows another example of the block configuration of the third embodiment. As shown in FIG. 12, in a block B22, cell and selection transistor configurations are provided in a symmetrical form with respect to lines which connect block selection transistors TS1 to TS4 to bit lines BL1, BL2 in addition to the configuration of FIG. 10. That is, block selection transistors TS5, TS6 are connected to a connection line L1 which connects one-side ends of the block selection transistors TS1, TS3 to the bit line BL1. The block selection transistor TS5 configures part of the cell and selection transistor configuration (only part of which is shown) and is connected to a parallel circuit of a ferroelectric capacitor TC5 and cell transistor TM5. The block selection transistor TS6 configures part of the cell and selection transistor configuration (only part of which is shown) and is connected to a parallel circuit of a ferroelectric capacitor TC6 and cell transistor TM6.

Further, block selection transistors TS7, TS8 are connected to a connection line L2 which connects one-side ends of the block selection transistors TS2, TS4 to the bit line BL2. The block selection transistor TS7 configures part of the cell and selection transistor configuration (only part of which is shown) and is connected to a parallel circuit of a ferroelectric capacitor TC7 and cell transistor TM7. The block selection transistor TS8 configures part of the cell and selection transistor configuration (only part of which is shown) and is connected to a parallel circuit of a ferroelectric capacitor TC8 and cell transistor TM8. Block selection signals BS5 to BS8 respectively supplied to the block selection transistors TS5 to TS8 are controlled by the control section CNT as shown in FIG. 3.

The configuration other than the block B22 is the same as that of the first embodiment. According to the configuration shown in FIG. 12, the block B22 having larger memory capacity can be attained in comparison with a case of FIG. 10.

Like the first embodiment, according to the semiconductor memory device of the third embodiment of the present invention, one end of the ferroelectric capacitor TC to be subjected to the read operation is connected to a first terminal BLS1 of the sense amplifier SA and the other end thereof is connected to a second terminal BLS2 of the sense amplifier SA after amplification by the sense amplifier SA. Thus, the same effect as that of the first embodiment can be attained.

Further, according to the third embodiment, two configurations each having a cell group CG and two block selection transistors TS are arranged in parallel. In addition, more configurations each having the cell group CG and two block selection transistors TS are connected to the respective connection lines which connect the block selection transistors TS1 to TS4 to the bit lines BL1, BL2. Thus, the blocks B21, B22 having a large memory capacity can be attained while the high-speed operation as shown in the first embodiment is attained.

Fourth Embodiment

Figure 13:
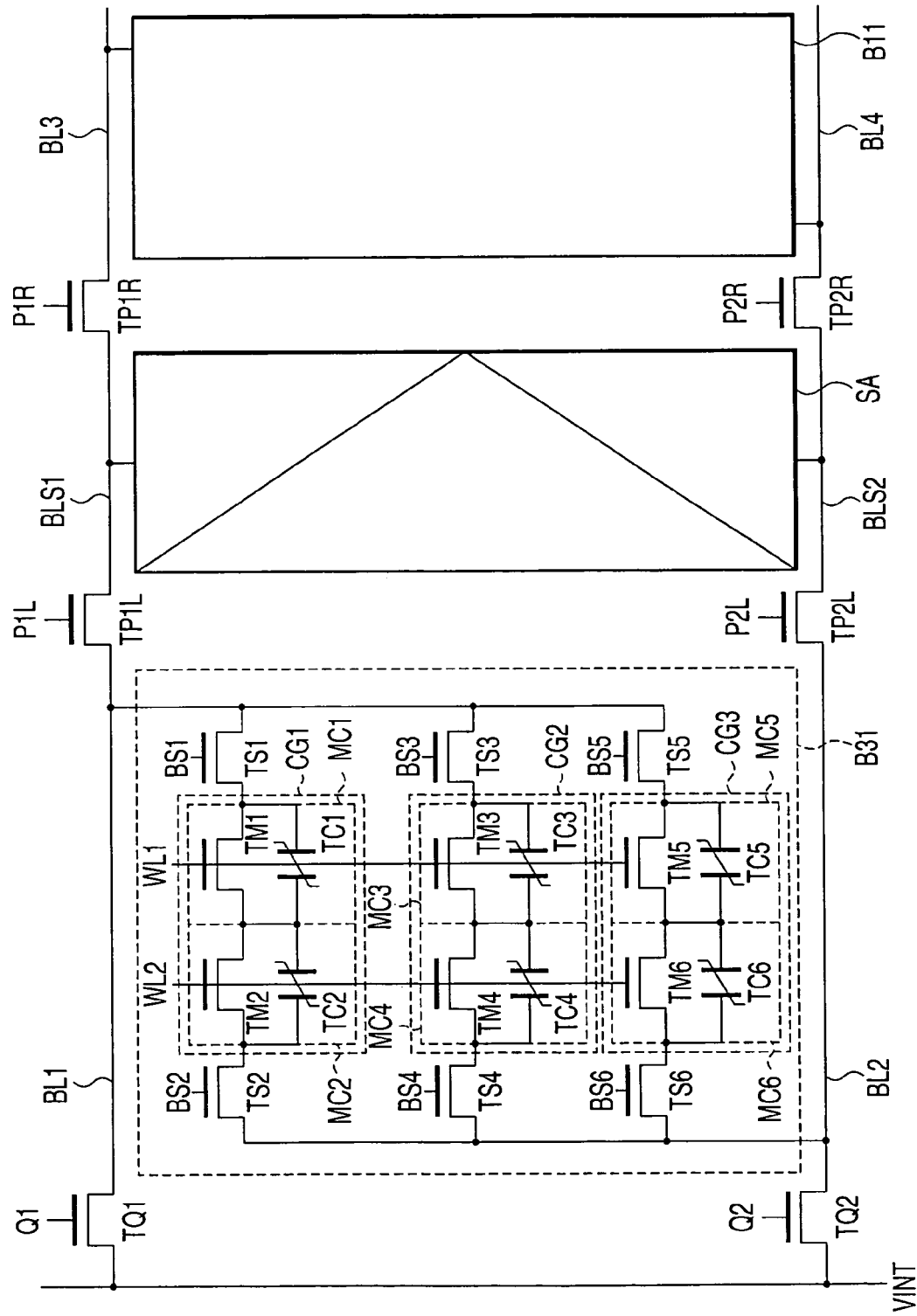
FIG. 13 is a diagram showing the configuration of a main section of a semiconductor memory device according to a fourth embodiment of the present invention.

A fourth embodiment has a block configuration obtained by developing the third embodiment. FIG. 13 is a diagram showing the configuration of the main section of a semiconductor memory device according to the fourth embodiment of the present invention. As shown in FIG. 13, a block B31 has a configuration including three parallel-connected circuit configurations each having a cell group and two block selection transistors which are serially connected. That is, a block selection transistor TS5, cell group CG3 and block selection transistor TS6 which are serially connected are arranged in addition to the configuration of FIG. 10 between bit lines BL1 and BL2.

The cell group CG3 includes a memory cell MC5 having a ferroelectric capacitor TC5 and cell transistor TM5 connected in parallel and a memory cell MC6 having a ferroelectric capacitor TC6 and cell transistor TM6 connected in parallel. The gates of the cell transistors TM1, TM3, TM5 are connected to a word line WL1. The gates of the cell transistors TM2, TM4, TM6 are connected to a word line WL2. The remaining configuration is the same as that of the first embodiment.

Figure 14:
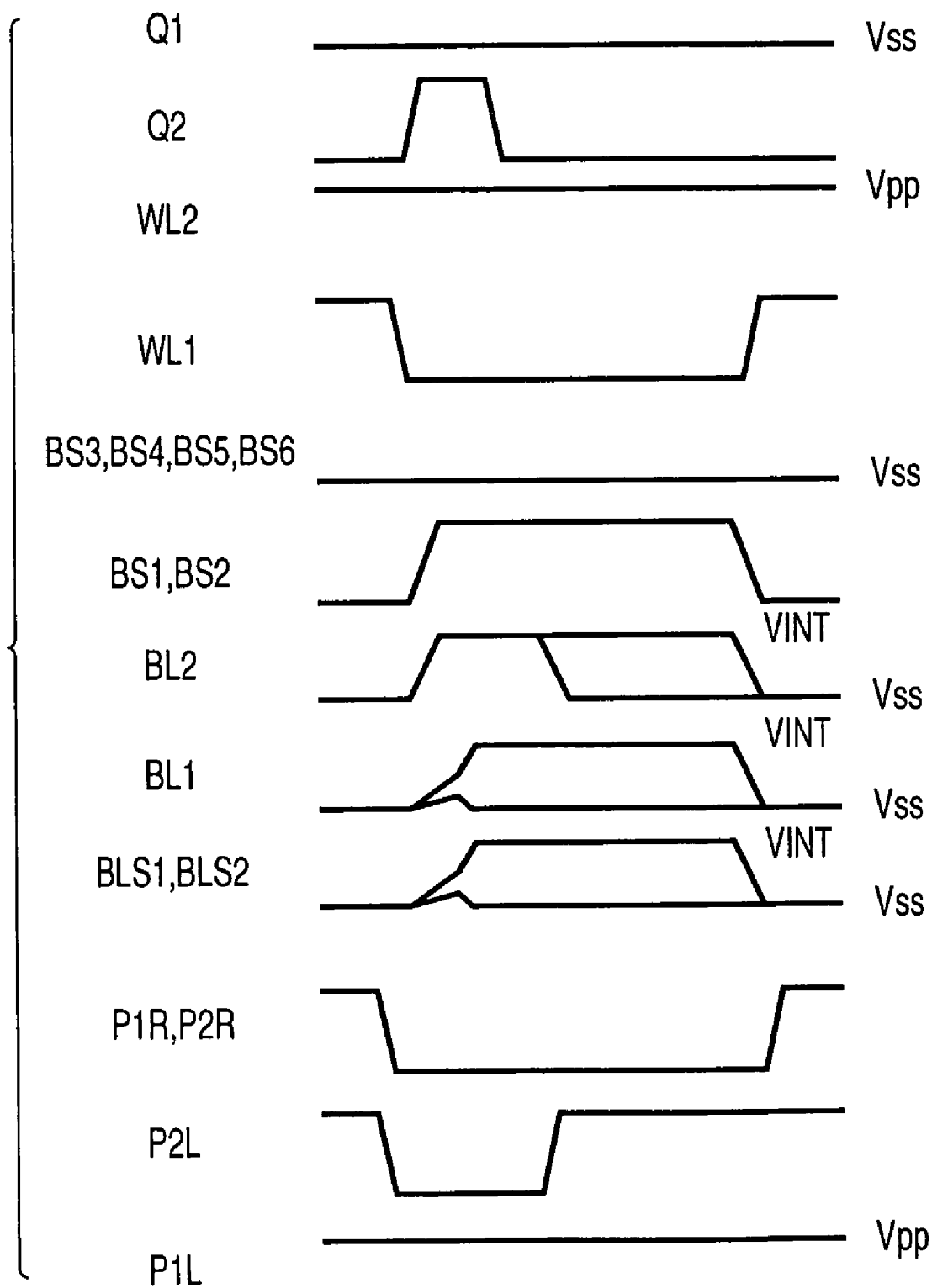
FIG. 14 is a timing chart showing an example of potentials of the main section of the semiconductor memory device according to the fourth embodiment.

FIG. 14 is a timing chart showing an example of potentials of the main section of the semiconductor memory device according to the fourth embodiment. FIG. 14 shows a case wherein the ferroelectric capacitor TC1 is subjected to the read operation. The operation of the semiconductor memory device according to the fourth embodiment is similar to the first embodiment. As shown in FIG. 14, only the block selection transistors TS1, TS2 among the block selection transistors TS1 to TS6 in the block B31, which are connected to the respective ends of the cell group CG1 containing the ferroelectric capacitor TC1, are turned ON at the read time. The block selection transistors TS3 to TS6 of the other cell groups CG2, CG3 are maintained in the OFF state. That is, the block selection signals BS3 to BS6 are kept set at the low level. When the ferroelectric capacitors TC3, TC4 belonging to the cell group CG2 are subjected to the read operation, the block selection transistors TS3, TS4 are turned ON and the block selection transistors TS1, TS2, TS5, TS6 are maintained in the OFF state. When the ferroelectric capacitors TC5, TC6 belonging to the cell group CG3 are subjected to the read operation, the block selection transistors TS5, TS6 are turned ON and the block selection transistors TS1 to TS4 are maintained in the OFF state. The operation performed after this is the same as that of the first embodiment shown in FIG. 4.

In FIG. 13, only one block is extracted and shown, but each block provided as shown in FIG. 2 can be configured to have the block B31 of FIG. 13. Further, the number of memory cells MC in one cell group CG can be set to a desired number as described in the first embodiment.

Like the first embodiment, according to the semiconductor memory device of the fourth embodiment of the present invention, one end of one of the ferroelectric capacitors TC1 to TC6, which is subjected to the read operation, is connected to a first terminal BLS1 of the sense amplifier SA and the other end thereof is connected to a second terminal BLS2 of the sense amplifier SA after amplification by the sense amplifier SA. Thus, the same effect as that of the first embodiment can be attained.

Further, according to the fourth embodiment, three configurations each having a cell group CG and two block selection transistors TS are arranged in parallel. Therefore, the block B31 having a large memory capacity can be attained while the high-speed operation as shown in the first embodiment is attained. Further, as is clearly understood from the third and fourth embodiments, the capacity of the block B can be easily increased by connecting a desired number of configurations each including a cell group CG and two block selection transistors TS in the block B in parallel.

Fifth Embodiment

Figure 15:
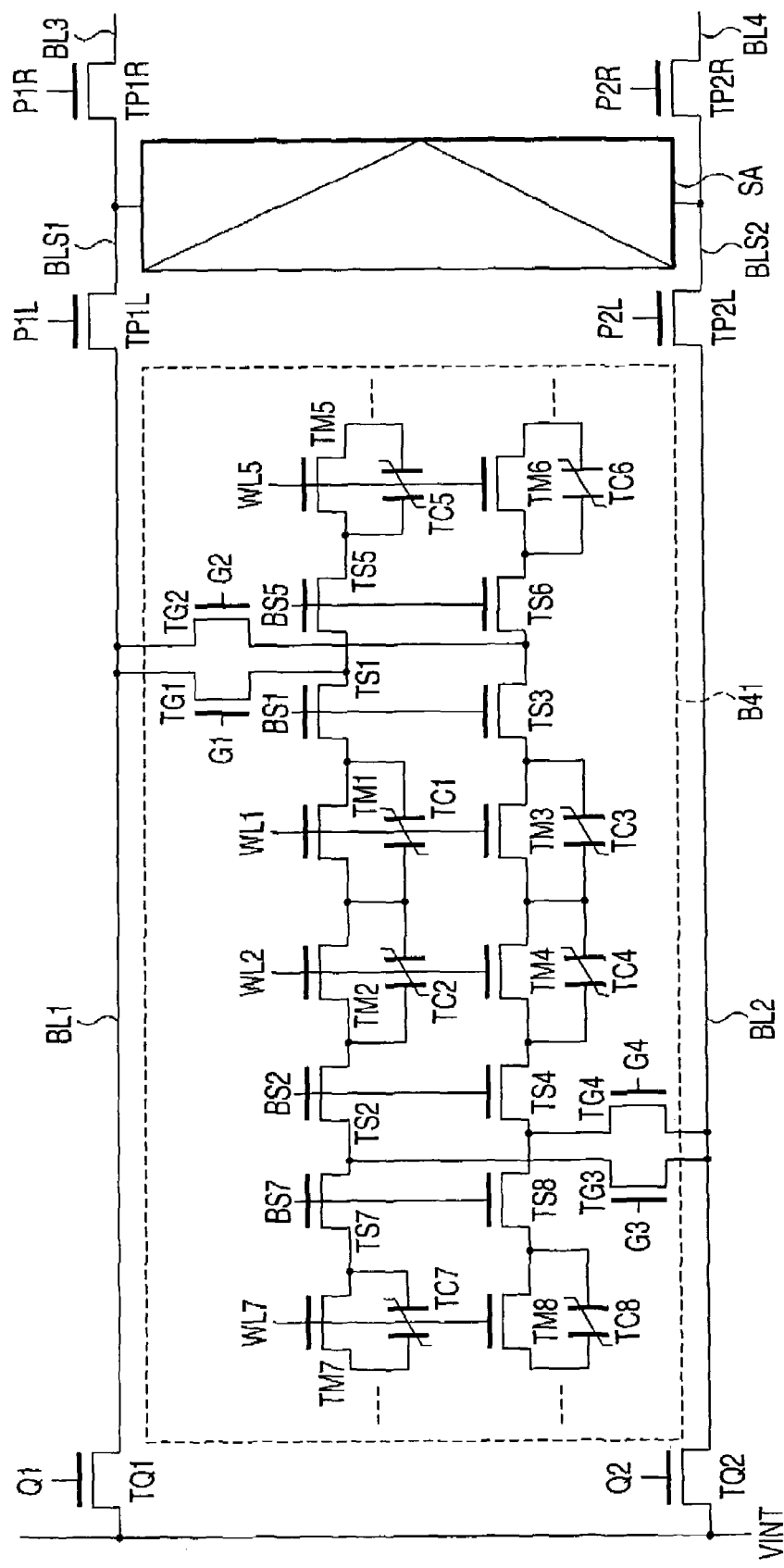
FIG. 15 is a diagram showing the configuration of a main section of a semiconductor memory device according to a fifth embodiment of the present invention.

In a fifth embodiment, transistors which selectively connect block selection transistors TS1 to TS4 to bit lines BL1, BL2 are provided. FIG. 15 is a diagram showing the configuration of the main section of a semiconductor memory device according to the fifth embodiment of the present invention. The configuration of the fifth embodiment is similar to the configuration shown in FIG. 12 of the third embodiment and portions which are different from those of FIG. 12 are mainly explained with reference to FIG. 15.

As shown in FIG. 15, the block selection transistors TS1, TS5 are connected to the bit line BL1 via an n-type MOS transistor (first gate circuit) TG1. The block selection transistors TS3, TS6 are connected to the bit line BL1 via an n-type MOS transistor (second gate circuit) TG2. Further, the block selection transistors TS2, TS7 are connected to the bit line BL2 via an n-type MOS transistor TG3. The block selection transistors TS4, TS8 are connected to the bit line BL2 via an n-type MOS transistor TG4. The gates of the gate transistors (gate circuits) TG1 to TG4 are respectively supplied with signals G1 to G4 controlled by the control section CNT as shown in FIG. 3.

Figure 16:
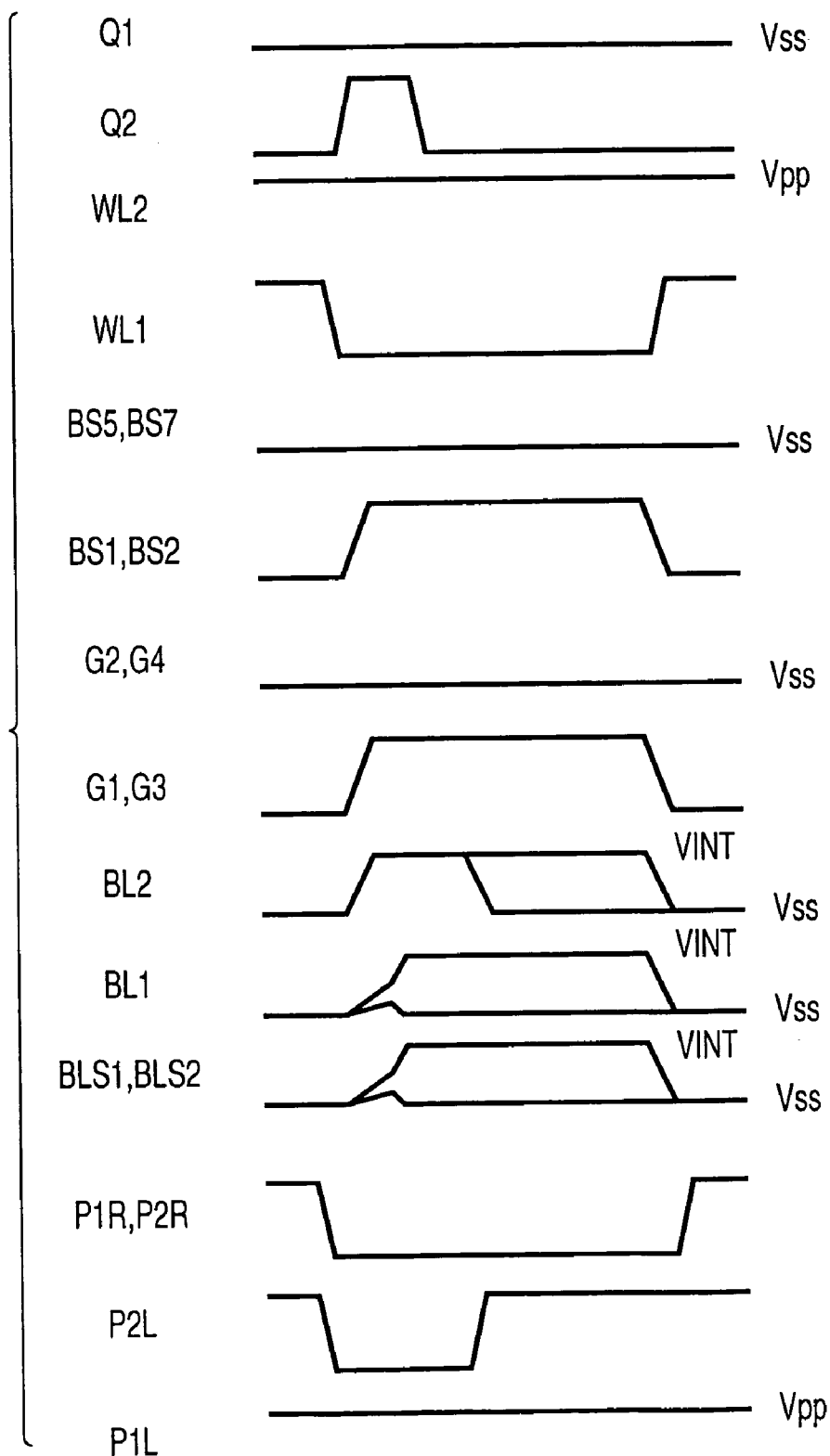
FIG. 16 is a timing chart showing an example of potentials of the main section of the semiconductor memory device according to the fifth embodiment.

FIG. 16 is a timing chart showing an example of potentials of the main section of the semiconductor memory device according to the fifth embodiment. FIG. 16 shows a case wherein the ferroelectric capacitor TC1 is subjected to the read operation as an example. As shown in FIG. 16, block selection signals BS5, BS7 other than the block selection signals BS1, BS2 supplied to the cell and selection transistor configuration to which the ferroelectric capacitor TC1 to be subjected to the read operation belongs are kept set at the low level during the read operation.

Signals G1, G3 are set to the high level at the same timing as the block selection signals BS1, BS2 and the word line WL1 is set to the low level. As a result, both ends of the ferroelectric capacitor TC1 are connected to the bit lines BL1, BL2. Since the block selection transistors TS5, TS7 are set in the OFF state, the other ferroelectric capacitors TC5, TC7 on the same row as that of the selected cell are not electrically connected to the bit lines BL1, BL2. Signals G2, G4 supplied to the gates of a cell and selection transistor configuration other than the cell and selection transistor configuration of a row containing the selected cell are kept set at the low level. Therefore, even if the block selection transistors TS3, TS4 are turned ON, data of the ferroelectric capacitors TC3, TC4 contained in a non-selected cell and selection transistor configuration is not read out onto the bit line BL1.

After the end of the rewriting operation, the signals G1, G3 are set to the low level at the same timing as the block selection signals BS1, BS2. The operation other than the operation described above is the same as that explained with reference to FIG. 4 (first embodiment).

Like the first embodiment, according to the semiconductor memory device of the fifth embodiment of the present invention, one end of the ferroelectric capacitor TC to be subjected to the read operation is connected to a first terminal BLS1 of the sense amplifier SA and the other end thereof is connected to a second terminal BLS2 of the sense amplifier SA after amplification by the sense amplifier SA. Thus, the same effect as that of the first embodiment can be attained.

Further, like the third embodiment, according to the fifth embodiment, the block B41 has a plurality of cell and selection transistor configurations. Thus, the block B41 having a large memory capacity can be realized.

Further, according to the fifth embodiment, the cell and selection transistor configurations are connected to the bit lines BL1, BL2 via the gate transistors TG1 to TG4. Generally, since a transistor has parasitic capacitance and the parasitic capacitance prevents the high-speed operation of a wiring with which the parasitic capacitance is associated, it is preferable to reduce the number of transistors connected to the bit line to minimum. According to the fifth embodiment, the number of transistors connected to one bit line (for example, bit line BL1) in one block B is set only to the number of rows of the cell and selection transistor configuration in one block B. That is, in the case of FIG. 15, the number is set to two, which is as many as the number of gate transistors TG1, TG2. Therefore, a higher operational speed can be attained, while the same memory capacity can be attained in comparison with the configuration (FIG. 12) in which none of the gate transistors TG1, TG2 are provided.

Sixth Embodiment

A sixth embodiment relates to the cross sectional structure of ferroelectric capacitors and cell transistors and a control method for a circuit based on the structure. The circuit configuration is the same as that of the first embodiment (FIG. 1).

Figure 17:
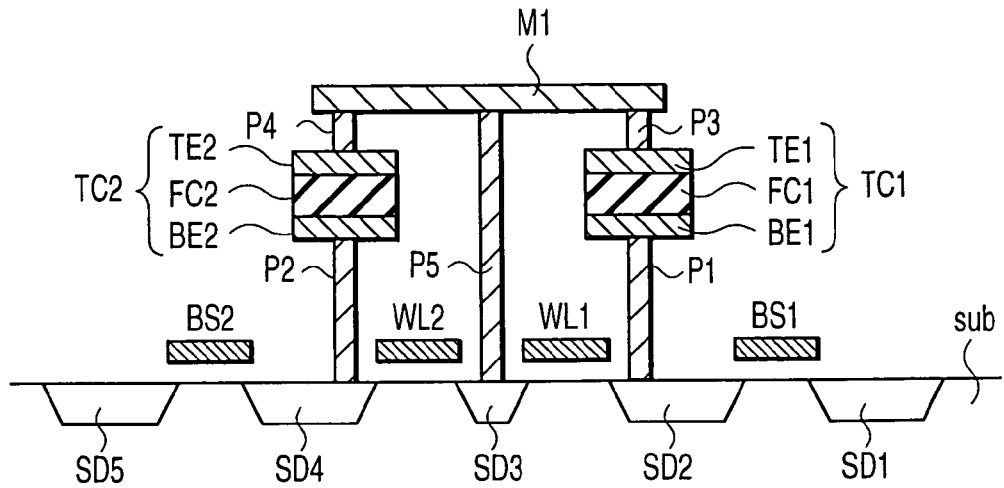
FIG. 17 is a view showing the cross sectional structure of a semiconductor memory device according to a sixth embodiment of the present invention.

FIG. 17 is a view showing the cross sectional structure of a semiconductor memory device according to the sixth embodiment of the present invention. As shown in FIG. 17, source/drain diffusion layers SD1 to SD5 are formed at proper intervals on the surface of a semiconductor substrate sub. The source/drain diffusion layer SD1 is connected to a bit line BL1 (not shown) via a contact (not shown). The source/drain diffusion layer SD5 is connected to a bit line BL2 (not shown) via a contact (not shown).

A gate electrode BS1 is formed above a portion of the semiconductor substrate sub which lies between the source/drain diffusion layers SD1 and SD2 with a gate insulating film (not shown) disposed therebetween. A gate electrode WL1 is formed above a portion of the semiconductor substrate sub which lies between the source/drain diffusion layers SD2 and SD3 with a gate insulating film (not shown) disposed therebetween. Further, a gate electrode WL2 is formed above a portion of the semiconductor substrate sub which lies between the source/drain diffusion layers SD3 and SD4 with a gate insulating film (not shown) disposed therebetween. A gate electrode BS2 is formed above a portion of the semiconductor substrate sub which lies between the source/drain diffusion layers SD4 and SD5 with a gate insulating film (not shown) disposed therebetween.

The source/drain diffusion layers SD1, SD2 and gate electrode BS1 are combined to configure a block selection transistor TS1. The source/drain diffusion layers SD2, SD3 and gate electrode WL1 are combined to configure a cell selection transistor TM1. The source/drain diffusion layers SD3, SD4 and gate electrode WL2 are combined to configure a cell selection transistor TM2. The source/drain diffusion layers SD4, SD5 and gate electrode BS2 are combined to configure a block selection transistor TS2.

A ferroelectric capacitor TC1 is formed above the source/drain diffusion layer SD2. The ferroelectric capacitor TC1 is configured by a ferroelectric film FC1 and an upper electrode TE1 and lower electrode BE1 which sandwich the ferroelectric film FC1. The lower electrode BE1 is connected to the source/drain diffusion layer SD2 via a plug P1.

A ferroelectric capacitor TC2 is formed above the source/drain diffusion layer SD4. The ferroelectric capacitor TC2 is configured by a ferroelectric film FC2 and an upper electrode TE2 and lower electrode BE2 which sandwich the ferroelectric film FC2. The lower electrode BE2 is connected to the source/drain diffusion layer SD4 via a plug P2.

A wiring layer M1 is arranged above the upper electrodes TE1, TE2. The wiring layer M1 is connected to the upper electrode TE1 via a contact P3, connected to the upper electrode TE2 via a contact P4 and connected to the source/drain diffusion layer SD3 via a contact P5.

As shown in FIG. 17, generally, the ferroelectric capacitor has a configuration in which the ferroelectric film is sandwiched between two electrodes in the vertical direction. Therefore, when attention is paid to one ferroelectric capacitor, the characteristics differ in a case wherein voltage is applied in a direction from the upper electrode to the lower electrode and in a case wherein voltage is applied in a direction from the lower electrode to the upper electrode. However, in the circuit configuration of the conventional semiconductor memory device, an electrode applied with driving voltage VINT at the data read time and an electrode onto which data is read out are fixed. Further, since the upper electrodes or lower electrodes of the adjacent ferroelectric capacitors are connected together, the direction of voltage applied is different for each ferroelectric capacitor. Thus, a data read margin is narrowed.

On the other hand, in the present embodiment of the present invention, as shown in the first embodiment, one of the bit lines BL1, BL2 which is connected to the power supply line VINT and the bit line onto which data is read out can be freely exchanged. Therefore, in the sixth embodiment, the control method for the circuit shown in FIG. 1 is determined according to the type of the ferroelectric capacitor to be subjected to the read operation in the semiconductor memory device having the cross sectional structure as shown in FIG. 17.

Figure 18:
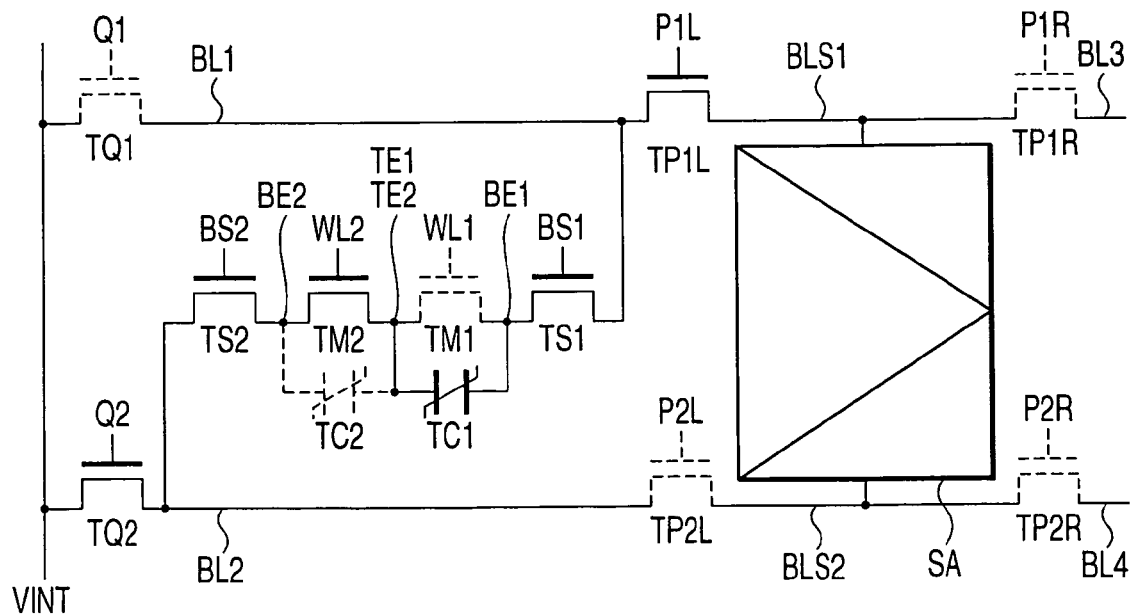
FIG. 18 is a diagram showing one state when data is read out from the ferroelectric capacitor of the circuit of FIG. 1.

FIGS. 18 and 19 each show one state of the semiconductor memory device according to the sixth embodiment. FIG. 18 shows the state in which the ferroelectric capacitor TC1 of the circuit with the configuration of FIG. 1 is subjected to the read operation. FIG. 19 shows the state in which the ferroelectric capacitor TC2 of the circuit with the configuration of FIG. 1 is subjected to the read operation.

As shown in FIG. 18, when the ferroelectric capacitor TC1 is subjected to the read operation, the bit line BL2 is connected to the power supply line VINT and data is read out onto the bit line BL1. That is, in the structure shown in FIG. 17, the upper electrode TE1 is electrically connected to the power supply line VINT and the lower electrode BE1 is electrically connected to the bit line BL1. The remaining operation is the same as that of the first embodiment.

As shown in FIG. 19, when the ferroelectric capacitor TC2 is subjected to the read operation, the bit line BL1 is connected to the power supply line VINT and data is read out onto the bit line BL2. That is, in the structure shown in FIG. 17, the upper electrode TE2 is electrically connected to the power supply line VINT and the lower electrode BE2 is electrically connected to the bit line BL1. The remaining operation is the same as that of the first embodiment.

As is clearly understood from FIGS. 17 to 19, the upper electrodes TE1, TE2 are electrically connected to the power supply line VINT and data is read out onto the bit line BL1 (or BL2) which is connected to the lower electrode BE1, BE2 irrespective of which one of the ferroelectric capacitors TC1 and TC2 is subjected to the read operation.

Figure 20:
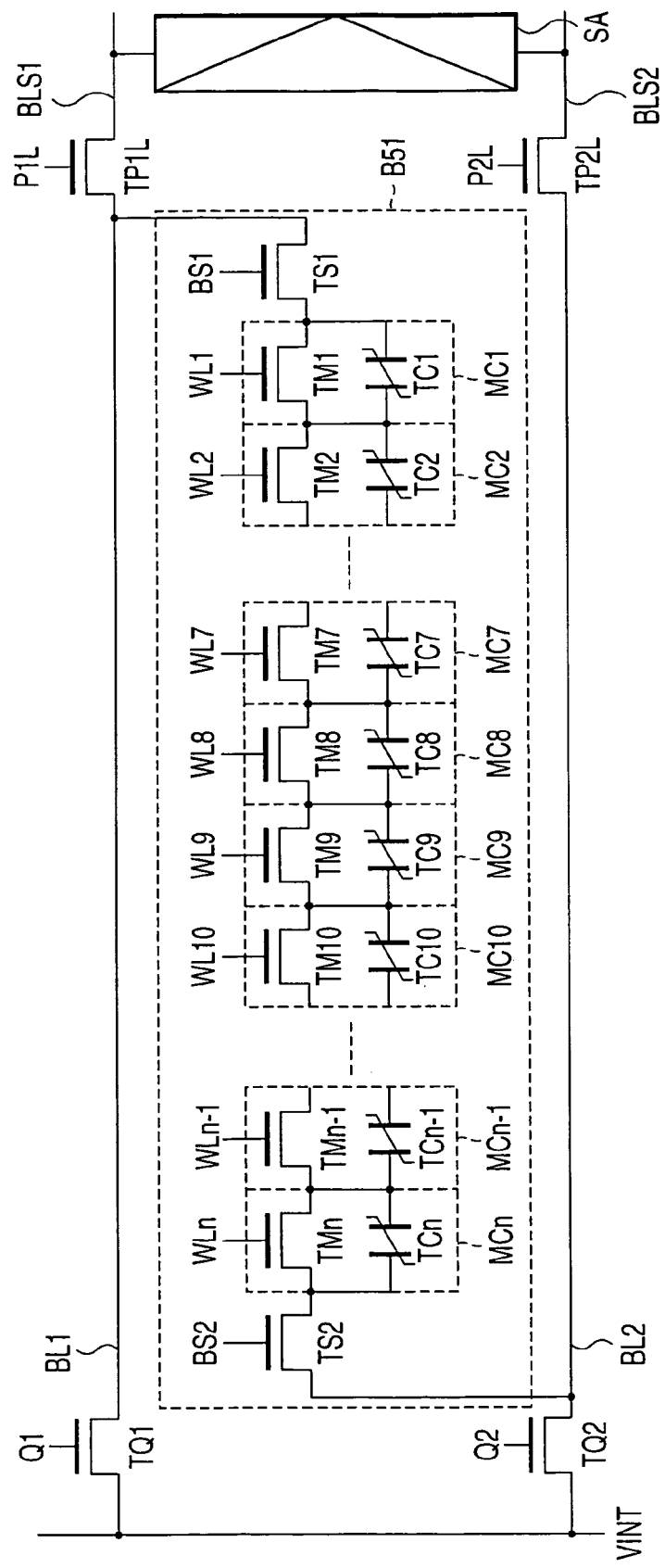
FIG. 20 is a diagram showing another example of the configuration of a main section of the semiconductor memory device according to the sixth embodiment.

FIGS. 17 to 19 show a case wherein the two ferroelectric capacitors TC1, TC2 are connected between the two block selection transistors TS1 and TS2, but this is not limitative and the present embodiment can be similarly applied to a case wherein three or more ferroelectric capacitors are provided. FIG. 20 shows another example of the main section of the sixth embodiment. As shown in FIG. 20, in a block B51, n memory cells MC configured by ferroelectric capacitors TC1 to TCn and cell transistors TM1 to TMn are provided between the block selection transistors TS1 and TS2. The potential of the word line WL is controlled by the control section CNT as shown in FIG. 3.

Figure 21:
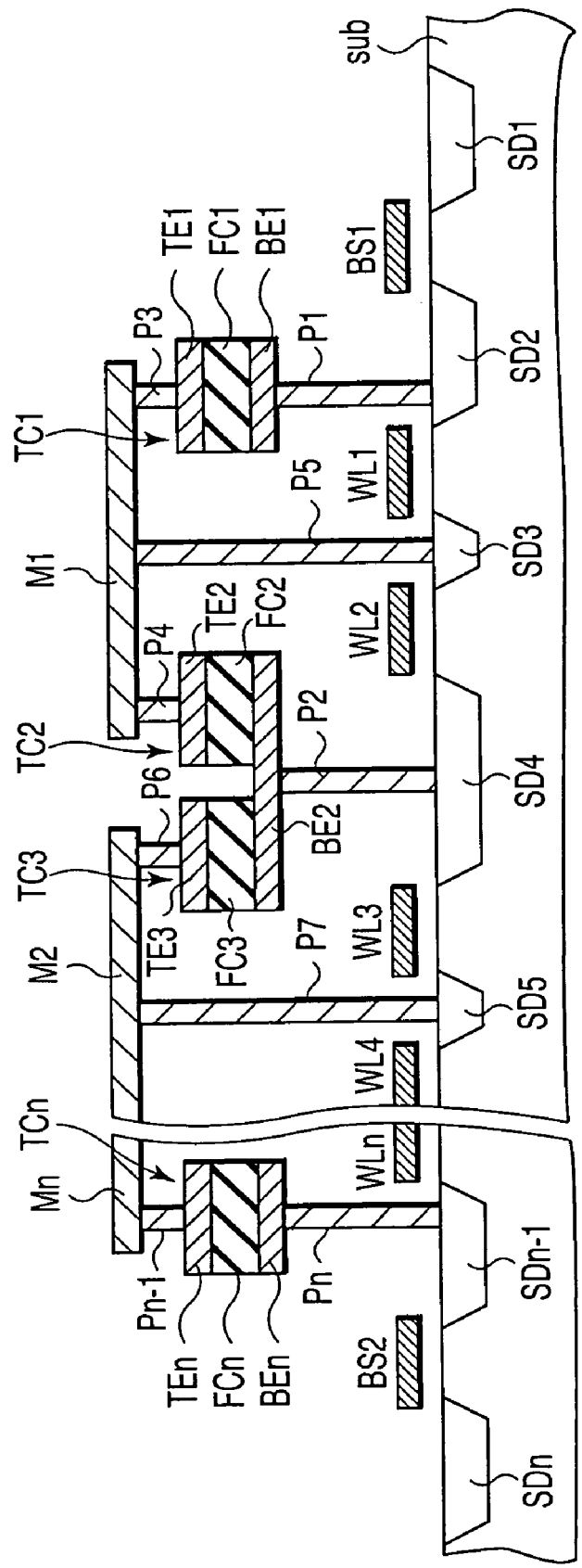
FIG. 21 is a view showing another example of the cross sectional structure of the semiconductor memory device according to the sixth embodiment.

FIG. 21 shows an example of the cross sectional structure of the circuit configuration shown in FIG. 20. As shown in FIG. 21, a ferroelectric capacitor TC3 includes an upper electrode TE3, ferroelectric film FC3 and lower electrode FC2 which is commonly used by the ferroelectric capacitor TC2. The upper electrode TE3 is connected to a source/drain diffusion layer SD5 via a contact P6, a wiring layer M2 formed to extend above the upper electrode TE3 and a contact P7. The source/drain diffusion layer SD5 is formed apart from a source/drain diffusion layer SD4 on the surface of the semiconductor substrate sub. The source/drain diffusion layers SD4, SD5 and a gate electrode WL3 formed above part of the semiconductor substrate sub which lies between the source/drain diffusion layers SD4 and SD5 configure a cell transistor TM3.

A required number of structures each including a region which extends from the source/drain diffusion layer SD3 to the source/drain diffusion layer SD5 in the lateral direction on the drawing sheet of FIG. 21 and ranges from the surface of the semiconductor substrate sub to the wiring layers M1, M2 are provided with the source/drain diffusion layer SD5 set as a starting point. The end of the repeated structures is connected to an upper electrode TEn of a ferroelectric capacitor TCn via a wiring layer Mn and contact Pn−1. The lower electrode BEn is connected to a source/drain diffusion layer SDn−1 via a contact Pn. The source/drain diffusion layers SDn−1, SDn are formed apart from each other on the surface of the semiconductor substrate sub. The source/drain diffusion layers SDn−1, SDn and a gate electrode BS2 formed above part of the semiconductor substrate sub which lies between the source/drain diffusion layers SDn−1 and SDn configure a block selection transistor TS2. The source/drain diffusion layer SDn is connected to the bit line BL2 (not shown).

In the configuration shown in FIGS. 20 and 21, the ON/OFF states of the transistors TQ1, TQ2, TP1L, TP2L are controlled so that the upper electrodes TE1 to TEn will be connected to the power supply line VINT at the access time irrespective of the ferroelectric capacitor to be subjected to the read operation, and data will be read out onto the bit line BL1 or BL2 connected to the lower electrodes BE1 to BEn.

In the above explanation, a case wherein the upper electrodes TE1 to TEn are connected to the power supply line VINT and data is read out onto the bit line BL1 or BL2 connected to the lower electrodes BE1 to BEn is explained as an example. However, a configuration can be made so that the lower electrodes BE1 to BEn will be connected to the power supply line VINT and data will be read out onto the bit line BL1 or BL2 connected to the upper electrodes TE1 to TEn. That is, it suffices as long as same one electrode of the upper electrode and the lower electrode in each of the ferroelectric capacitors TC1 to TCn is connected to the power supply line VINT and same one electrode of the two electrodes in each of the ferroelectric capacitors TC1 to TCn is connected to the bit line BL.

Like the first embodiment, according to the semiconductor memory device of the sixth embodiment of the present invention, one end of the ferroelectric capacitor TC to be subjected to the read operation is connected to a first terminal BLS1 of the sense amplifier SA and the other end thereof is connected to a second terminal BLS2 of the sense amplifier SA after amplification by the sense amplifier SA. Thus, the same effect as that of the first embodiment can be attained.

Further, according to the sixth embodiment, same one electrode of the upper electrode and the lower electrode in each of the ferroelectric capacitors TC1 to TCn is connected to the power supply line VINT and same one electrode of the two electrodes in each of the ferroelectric capacitors TC1 to TCn is connected to the bit line BL. Therefore, even if the characteristic of the ferroelectric capacitors TC is changed according to the voltage application direction, voltage is applied to at least each of the ferroelectric capacitors TC in the same direction. As a result, a variation in the read margin for each ferroelectric capacitor TC can be suppressed and a semiconductor memory device in which erroneous operations hardly occur can be provided.

Seventh Embodiment

Figure 22:
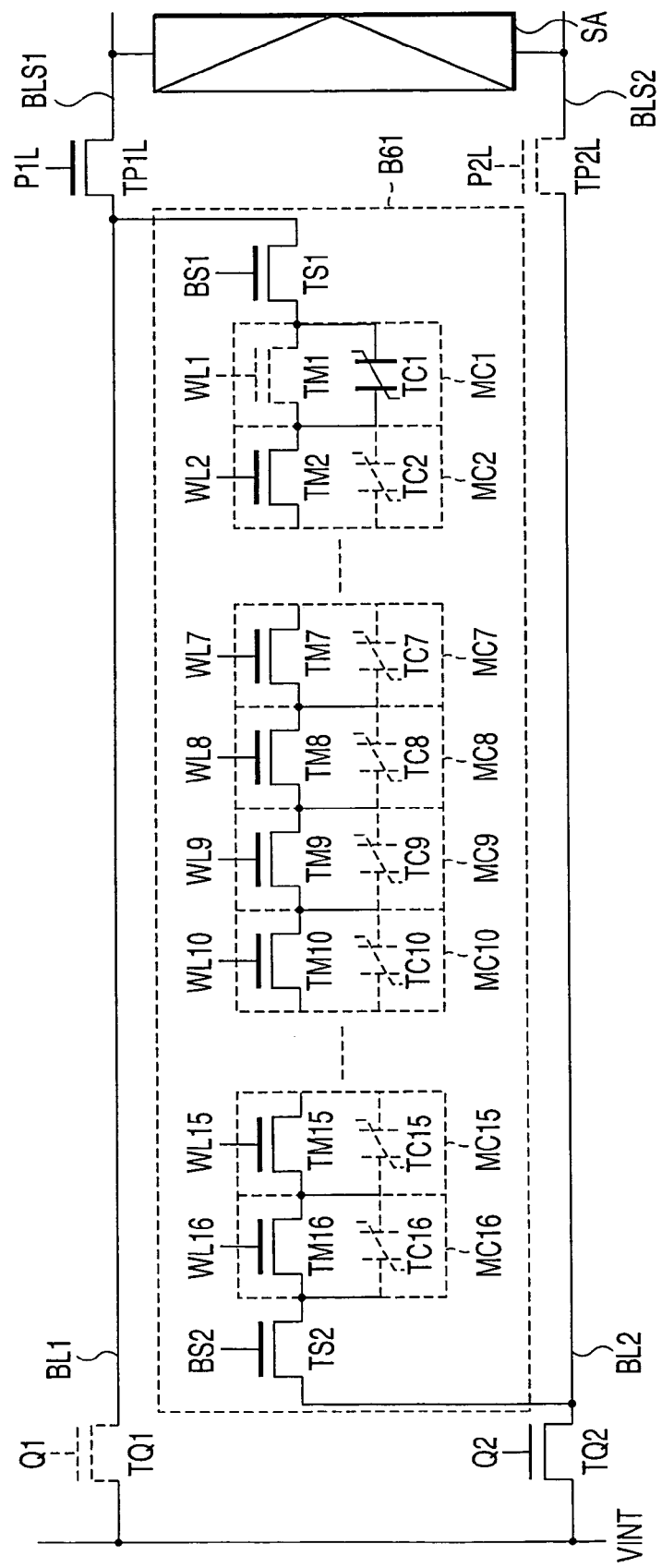
FIG. 22 is a diagram showing one state when data is read out from the ferroelectric capacitor of a semiconductor memory device according to a seventh embodiment of the present invention.
Figure 23:
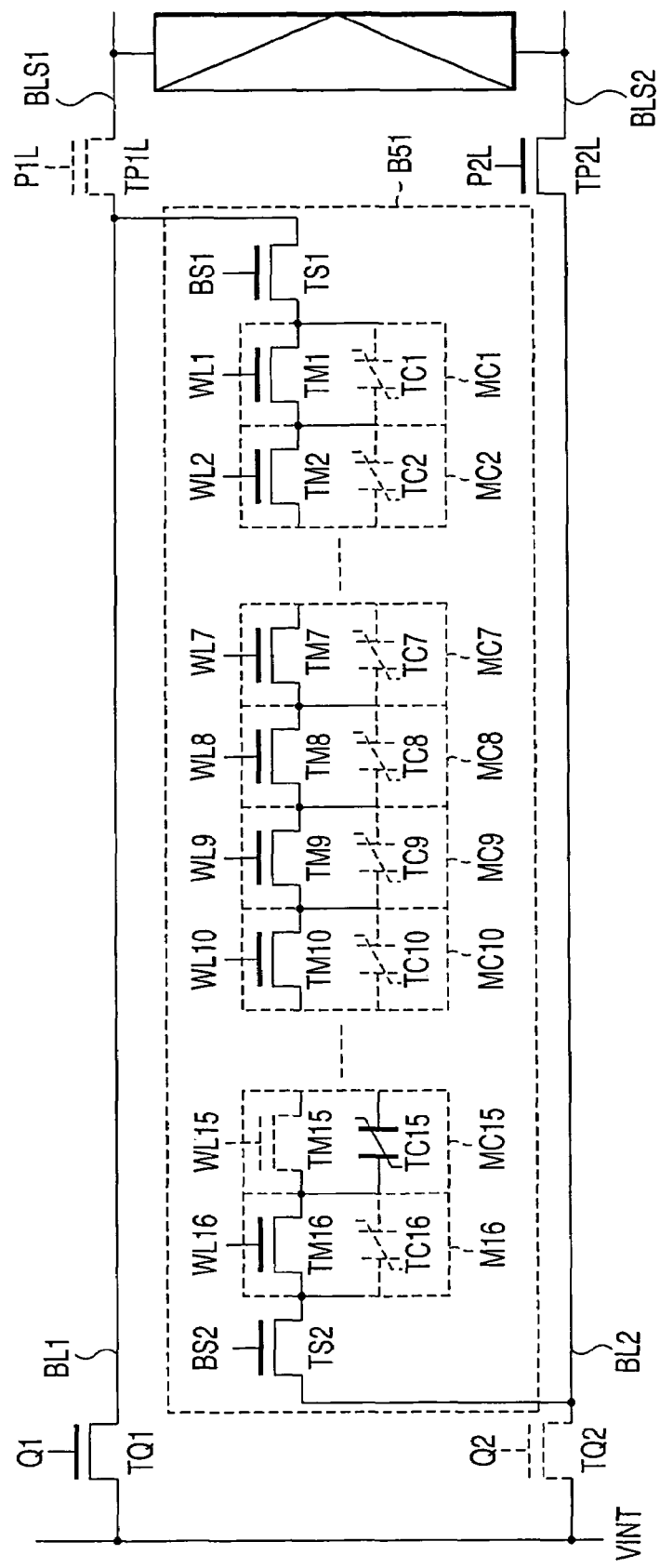
FIG. 23 is a diagram showing one state when data is read out from the ferroelectric capacitor of the semiconductor memory device according to the seventh embodiment.

A seventh embodiment is an application example of the first embodiment and relates to a control method in a case wherein the number of memory cells MC between block selection transistors TS1 and TS2 is large. FIGS. 22, 23 each show the configuration of the main section of a semiconductor memory device according to the seventh embodiment of the present invention and show one state when data is read out from a ferroelectric capacitor TC.

As shown in FIGS. 22, 23, a block B61 includes the block selection transistors TS1, TS2 and 16 memory cells MC1 to MC16 serially connected between the block selection transistors TS1 and TS2. The memory cells MC1 to MC16 are respectively configured by ferroelectric capacitors TC1 to TC16 and cell transistors TM1 to TM16 which are connected in parallel. Potentials of word lines WL1 to WL16 which are respectively connected to the gates of the cell transistors TM1 to TM16 are controlled by the control section CNT as shown in FIG. 3.

Next, the control method for the semiconductor memory device of the seventh embodiment is explained below. As shown in FIGS. 22, 23, the control operation is performed to read out data onto one of the bit lines BL1 and BL2 which is closer to one of the ferroelectric capacitors TC1 to TC16 to be subjected to the read operation and electrically connect the other bit line to the power supply line VINT. That is, data from the ferroelectric capacitors TC1 to TC8, which are half of the ferroelectric capacitors TC1 to TC16 and closer to the bit line BL1, is read out onto the bit line BL1. Therefore, as shown in FIG. 22, the transistor TQ1 is turned OFF and the transistor TQ2 is turned ON to electrically connect the bit line BL2 to the power supply line VINT. The other operations are the same as those of the first embodiment.

On the other hand, data from the ferroelectric capacitors TC9 to TC16, which are the remaining half of the ferroelectric capacitors TC1 to TC16 and closer to the bit line BL2, is read out onto the bit line BL2. Therefore, as shown in FIG. 23, the transistor TQ2 is turned OFF and the transistor TQ1 is turned ON to electrically connect the bit line BL1 to the power supply line VINT. The other operations are the same as those of the first embodiment.

In FIGS. 22, 23, a case wherein the number of memory cells provided between the block selection transistors TS1 and TS2 is 16 is given as an example. However, as described above, the number of memory cells can be freely determined as long as the control operation is performed to read out data onto one of the bit lines BL1 and BL2 which is reached via a shorter current passage.

Like the first embodiment, according to the semiconductor memory device of the seventh embodiment of the present invention, one end of the ferroelectric capacitor TC to be subjected to the read operation is connected to a first terminal BLS1 of the sense amplifier SA and the other end thereof is connected to a second terminal BLS2 of the sense amplifier SA after amplification by the sense amplifier SA. Thus, the same effect as that of the first embodiment can be attained.

Further, according to the seventh embodiment, data is read out onto one of the bit lines BL1, BL2 which is reached via a shorter current passage from one of the ferroelectric capacitors TC1 to TC16 to be subjected to the read operation. The other one of the bit lines BL1, BL2 is applied with the driving potential VINT. Therefore, the number of cell transistors TM1 to TM16 which are passed through in order to reach one of the bit lines BL1, BL2 can be reduced by at least half in comparison with a case wherein the bit line applied with the driving potential and the bit line supplied with data are fixed as in the conventional case. Thus, a semiconductor memory device in which the parasitic capacitance associated with the cell transistors TM1 to TM16 as viewed from one of the bit lines BL1, BL2 onto which data is read out is reduced by half and a high read potential can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a first cell group having at least two memory cells which are serially connected, the memory cell including a ferroelectric capacitor and a transistor which are connected in parallel;
    a first bit line selectively electrically connected to one end of the first cell group;
    a second bit line selectively electrically connected to another end of the first cell group;
    a first power supply connection circuit which selectively electrically connects a power supply line to the second bit line, the power supply line having a first potential;
    a sense amplifier which has a first terminal electrically connected to the first bit line, generates one of the first potential and a second potential onto the first terminal according to data stored in the memory cell and generates another one of the first potential and the second potential onto a second terminal thereof; and a first bit line connection circuit which selectively electrically connects the second terminal to the second bit line.

2. The device according to claim 1, further comprising
a first block connection circuit which selectively electrically connects the one end of the first cell group to the first bit line, and
a second block connection circuit which selectively electrically connects the another end of the first cell group to the second bit line.

3. The device according to claim 2, further comprising
a second cell group having at least two memory cells which are serially connected, the memory cell including a ferroelectric capacitor and a transistor which are connected in parallel,
a third block connection circuit which selectively electrically connects one end of the second cell group to the first bit line, and
a fourth block connection circuit which selectively electrically connects another end of the second cell group to the second bit line.

4. The device according to claim 2, further comprising
a first gate circuit which selectively electrically connects the first block connection circuit to the first bit line,
a third block connection circuit having one end connected to a connection node of the first gate transistor and the first block connection circuit,
a second gate circuit which selectively electrically connects the second block connection circuit to the second bit line, and
a fourth block connection circuit having one end connected to a connection node of the second gate transistor and the second block connection circuit.

5. The device according to claim 1, further comprising a control section which turns on the first power supply connection circuit and turns off the first bit line connection circuit when data is read out from the memory cell.

6. The device according to claim 5, wherein the control section further has a function of turning off the first power supply connection circuit and turning on the first bit line connection circuit after the sense amplifier generates the first potential and the second potential.

7. The device according to claim 1, further comprising
a second power supply connection circuit which selectively electrically connects the first bit line to the power supply line, and
a second bit line connection circuit which selectively electrically connects the first terminal to the first bit line.

8. The device according to claim 7, further comprising a control section which performs one of a first control and a second control when data is read out from the memory cell,
the control section, in the first control, turns on the first power supply connection circuit and turns off the first bit line connection circuit while the second power supply connection circuit is kept off and the second bit line connection circuit is kept on, and
the control section, in the second control, turns on the second power supply connection circuit and turns off the second bit line connection circuit while the first power supply connection circuit is kept off and the first bit line connection circuit is kept on.

9. The device according to claim 8, wherein the control section further has a function of
turning off the first power supply connection circuit and turning on the first bit line connection circuit after the sense amplifier generates the first potential and the second potential in the first control and
turning off the second power supply connection circuit and turning on the second bit line connection circuit after the sense amplifier generates the first potential and the second potential in the second control.

10. The device according to claim 8, wherein the control section performs the first control when data is read out from one of adjacent two memory cells and performs the second control when data is read out from another memory cell of adjacent two memory cells.

11. The device according to claim 8, wherein
the ferroelectric capacitors include an upper electrode, a lower electrode and a ferroelectric film sandwiched between the upper electrode and lower electrode and,
the control section selects one of the first control and the second control to electrically connect the upper electrode to the power supply line, whichever of the ferroelectric capacitor is subjected to a read operation.

12. The device according to claim 8, wherein
the ferroelectric capacitors include an upper electrode, a lower electrode and a ferroelectric film sandwiched between the upper electrode and lower electrode and,
the control section selects one of the first control and the second control to electrically connect the lower electrode to the power supply line, whichever of the ferroelectric capacitor is subjected to a read operation.

13. The device according to claim 8, wherein the control section
performs the first control when a current passage ranging from the memory cell to be subjected to a read operation to the first bit line in reading is shorter than a current passage ranging from the memory cell to be subjected to the read operation to the second bit line in reading and,
performs the second control when a current passage ranging from the memory cell to be subjected to a read operation to the second bit line in reading is shorter than a current passage ranging from the memory cell to be subjected to the read operation to the first bit line in reading.

14. The device according to claim 7, further comprising
a third bit line, and
a third bit line connection circuit which selectively electrically connects the second terminal to the third bit line.

15. The device according to claim 14, further comprising a control section which turns on the third bit line connection circuit while the sense amplifier is generating the first potential and the second potential.

16. The device according to claim 14, further comprising
a fourth bit line, and
a fourth bit line connection circuit which selectively electrically connects the first terminal to the fourth bit line.

* * * * *